US009129891B2

(12) United States Patent
Endoh et al.

(10) Patent No.: US 9,129,891 B2
(45) Date of Patent: Sep. 8, 2015

(54) SEMICONDUCTOR DEVICE

(71) Applicants: FUJITSU LIMITED, Kawasaki (JP); National Institute of Information and Communications Technology, Koganei (JP)

(72) Inventors: Akira Endoh, Machida (JP); Issei Watanabe, Tokyo (JP)

(73) Assignees: FUJITSU LIMITED, Kawasaki (JP); NATIONAL INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 237 days.

(21) Appl. No.: 13/626,137

(22) Filed: Sep. 25, 2012

(65) Prior Publication Data

US 2013/0075698 A1    Mar. 28, 2013

(30) Foreign Application Priority Data

Sep. 27, 2011    (JP) .................................. 2011-211076

(51) Int. Cl.
   *H01L 29/778*    (2006.01)
   *H01L 29/205*    (2006.01)
   *H01L 29/66*    (2006.01)

(52) U.S. Cl.
   CPC ........ *H01L 29/205* (2013.01); *H01L 29/66462* (2013.01); *H01L 29/7784* (2013.01)

(58) Field of Classification Search
   CPC .............. H01L 29/151; H01L 21/0254; H01L 29/2003; H01L 29/205; H01L 29/365; H01L 29/66462; H01L 29/7787

USPC .......................................................... 257/194
See application file for complete search history.

(56) References Cited

U.S. PATENT DOCUMENTS

| 5,856,684 A * | 1/1999 | Wang et al. .................... 257/191 |
| 6,429,468 B1 * | 8/2002 | Hsu et al. ....................... 257/194 |
| 2011/0156100 A1 * | 6/2011 | Chang et al. ................... 257/194 |

FOREIGN PATENT DOCUMENTS

| JP | 08-148695 | 6/1996 |
| JP | 2004-281702 A | 10/2004 |

OTHER PUBLICATIONS

Kulbachinskii et al., "Electron effective masses in an InGaAs quantum well with InAs and GaAs inserts," 2012 Semicond. Sci. Technol. 27, 035021; doi:10.1088/0268-1242/27/3/035021.*

(Continued)

*Primary Examiner* — Peniel M Gumedzoe
*Assistant Examiner* — Christopher Johnson
(74) *Attorney, Agent, or Firm* — Kratz, Quintos & Hanson

(57) ABSTRACT

A semiconductor device includes a first semiconductor layer provided over a substrate; an electron transit layer contacting a top of the first semiconductor layer; and a second semiconductor layer contacting a top of the electron transit layer, wherein the electron transit layer has a dual quantum well layer having a structure where a first well layer, an intermediate barrier layer, and a second well layer are sequentially stacked, an energy of a conduction band of the intermediate barrier layer is lower than an energy of conduction band of the first semiconductor layer and the second semiconductor layer, and a ground level is generated in the first and second well layers, and a first excitation level is generated in the dual quantum well layer.

20 Claims, 24 Drawing Sheets

(56) References Cited

OTHER PUBLICATIONS

Sugiyama et al., "High-electron-mobility In0.53Ga0.47As/In0.8Ga0.2As composite-channel modulation-doped structures grown by metal-organic vapor-phase epitaxy," Indium Phosphide & Related Materials (IPRM), 2010 International Conference, pp. 1,4, May 31, 2010-Jun. 4, 2010; doi: 10.1109/ICIPRM.2010.5516265.*

S. Yeon, et al.; 610 GHz InAlAs/In0.75GaAs Metamorphic HEMTs with an Ultra-Short 15-nm-Gate; IEDM Technical Digest; 2007; pp. 613-616 (4 Sheets).

D. Kim, et al.; "30-nm InAs PHEMTs With fT=644 GHz and fmax = 681 GHz;" IEEE Electron Device Letters; vol. 31; No. 8; Aug. 2010; pp. 806-808 (3 Sheets).

A. Leuther, et al.; "20 nm Metamorphic HEMT with 660 GHz fT;" IPRM 2011 (International Conference of Indium Phosphide and Related Materials 2011); 2011; pp. 295-298 (4 Sheets).

Office Action of JP Patent Application No. 2011-211076 dated May 19, 2015, and relevant translation of the O.A.

* cited by examiner

SEMICONDUCTOR DEVICE

CROSS-REFERENCE TO RELATED APPLICATION

This application is based upon and claims the benefit of priority of the prior Japanese Patent Application No. 2011-211076, filed on Sep. 27, 2011, the entire contents of which are incorporated herein by reference.

FIELD

The present disclosure relates to a semiconductor device.

BACKGROUND

InP-based high electron mobility transistors (HEMTs) have been used, which can operate in the millimeter-wave (about 30 to about 300 GHz) or submillimeter-wave (about 300 GHz to about 3 THz) regions, for example.

In InP-based HEMTs, $In_{0.53}Ga_{0.47}As$ which lattice-matches with an InP substrate have been used as a material of a channel layer (electron transit layer). Further, pseudo lattice-matched channel materials have been used, where the indium (In) content is increased to about 70-80% in order to reduce the effective mass of carrier electrons and further increase the device speed. Currently, such InP-based HEMTs can achieve a cut-off frequency $f_T$, which is a barometer indicating device speed enhancement, of 600 GHz or higher.

Additionally, composite channel HEMTs have been used, which use, as a channel layer, an InGaAs/InAs/InGaAs quantum well layer which includes InAs having an even further reduced energy (potential) of the conduction band in InGaAs. In such HEMTs, since the effective mass of electrons in the Γ valley in the InAs layer is smaller than the effective mass of electrons in the Γ valley in the InGaAs layer, many electrons as possible exist in the InAs layer, thereby increasing the velocity of electrons in the channel layer. This can achieve a further speed enhancement. In such InGaAs/InAs/InGaAs composite channel HEMTs, not only the cut-off frequency $f_T$ but also the maximum oscillation frequency $f_{max}$ exceed 600 GHz.

SUMMARY

A semiconductor device includes a first semiconductor layer provided over a substrate; an electron transit layer contacting a top of the first semiconductor layer; and a second semiconductor layer contacting a top of the electron transit layer, wherein the electron transit layer has a dual quantum well layer having a structure where a first well layer, an intermediate barrier layer, and a second well layer are sequentially stacked, an energy of a conduction band of the intermediate barrier layer is lower than an energy of conduction band of the first semiconductor layer and the second semiconductor layer, and a ground level is generated in the first and second well layers, and a first excitation level is generated in the dual quantum well layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an InGaAs/InAs/InGaAs composite channel HEMT, an InAs layer (well layer) cannot be grown thick since InAs has a higher lattice constant. Hence, it becomes difficult that many electrons as possible exist in the InAs layer where the effective mass of the electrons is reduced. In contrast, the crystalline quality of the InAs layer deteriorates when the InAs layer is grown too thick, which hinders a substantial improvement in the characteristics.

In an InGaAs/InAs/InGaAs composite channel HEMT, electrons are confined two-dimensionally in a channel layer, inducing generation of the quantum levels. When the total thickness of the quantum well layer used as a channel layer in an InGaAs/InAs/InGaAs composite channel HEMT is about 10 nm, two to three quantum levels are generated in the quantum well layer. If an electric field is applied to the HEMT or the HEMT has a higher electron density, the possibility that more electrons exist not only in the ground level but also in the first excitation level, is increased.

Figure 21:
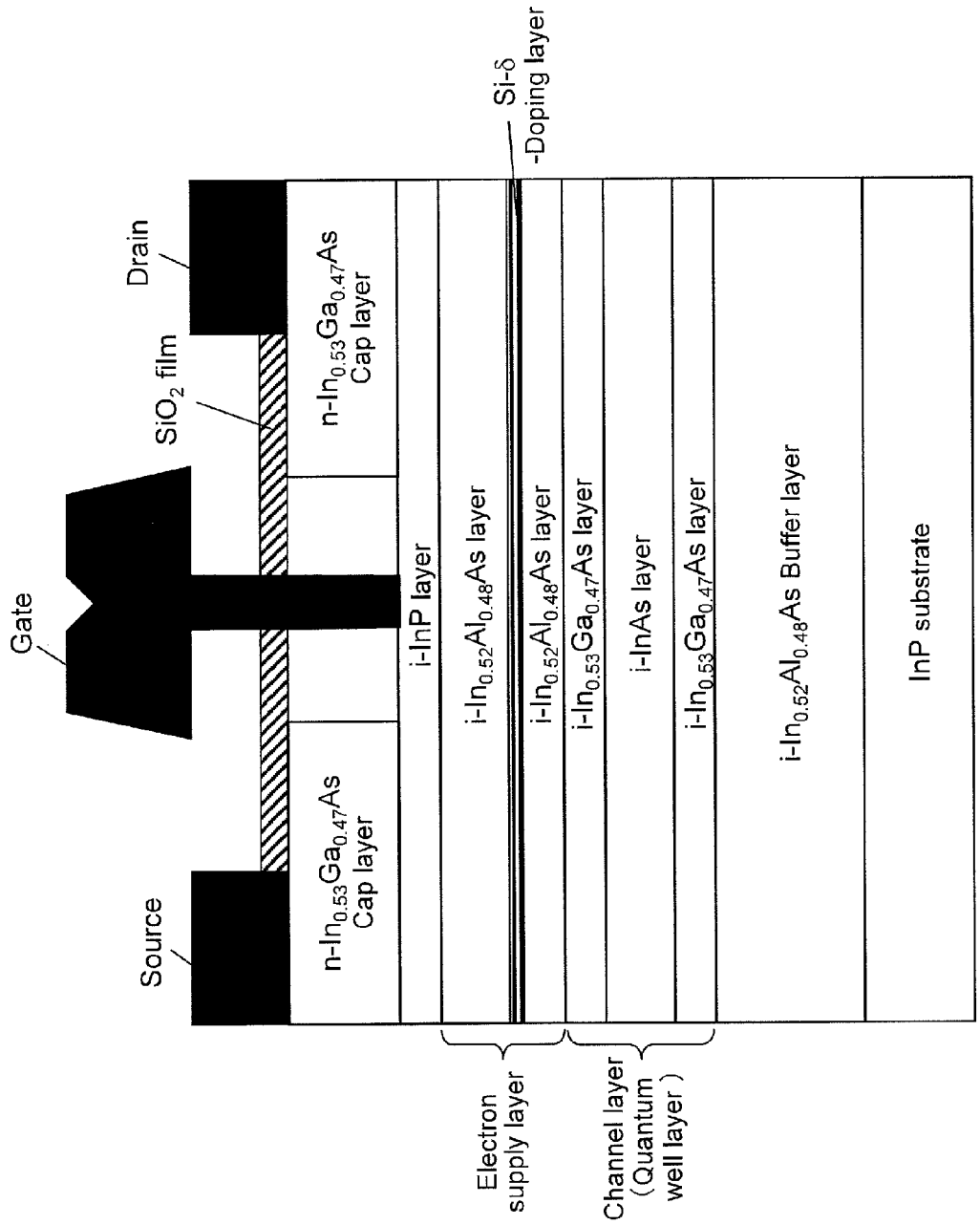
FIG. 21 is a schematic cross-sectional view illustrating the structure of a composite channel HEMT.
Figure 22:
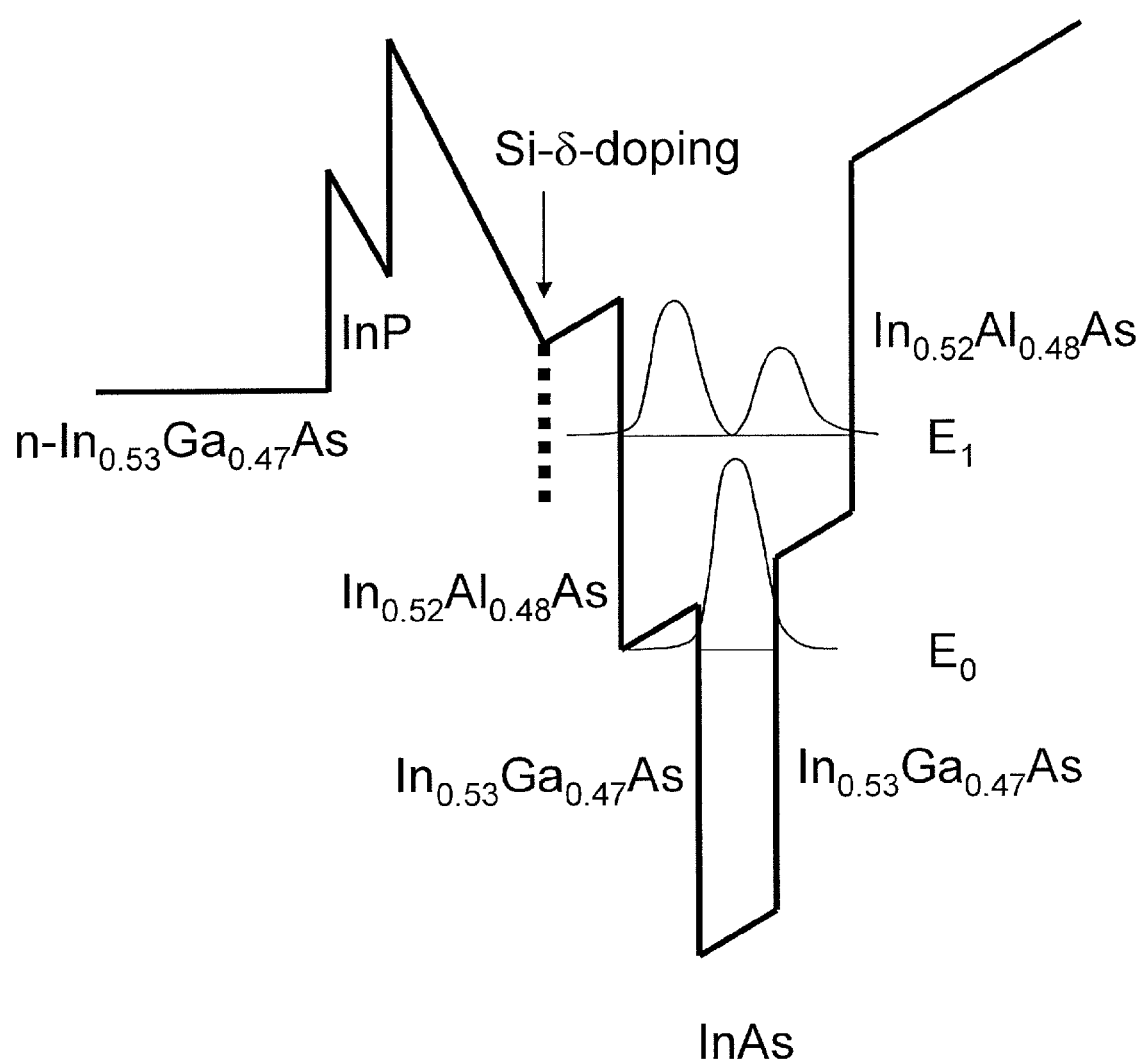
FIG. 22 is a schematic diagram illustrating the band structure of the conduction band in a composite channel HEMT, illustrating the issue of the present embodiments.
Figure 23:
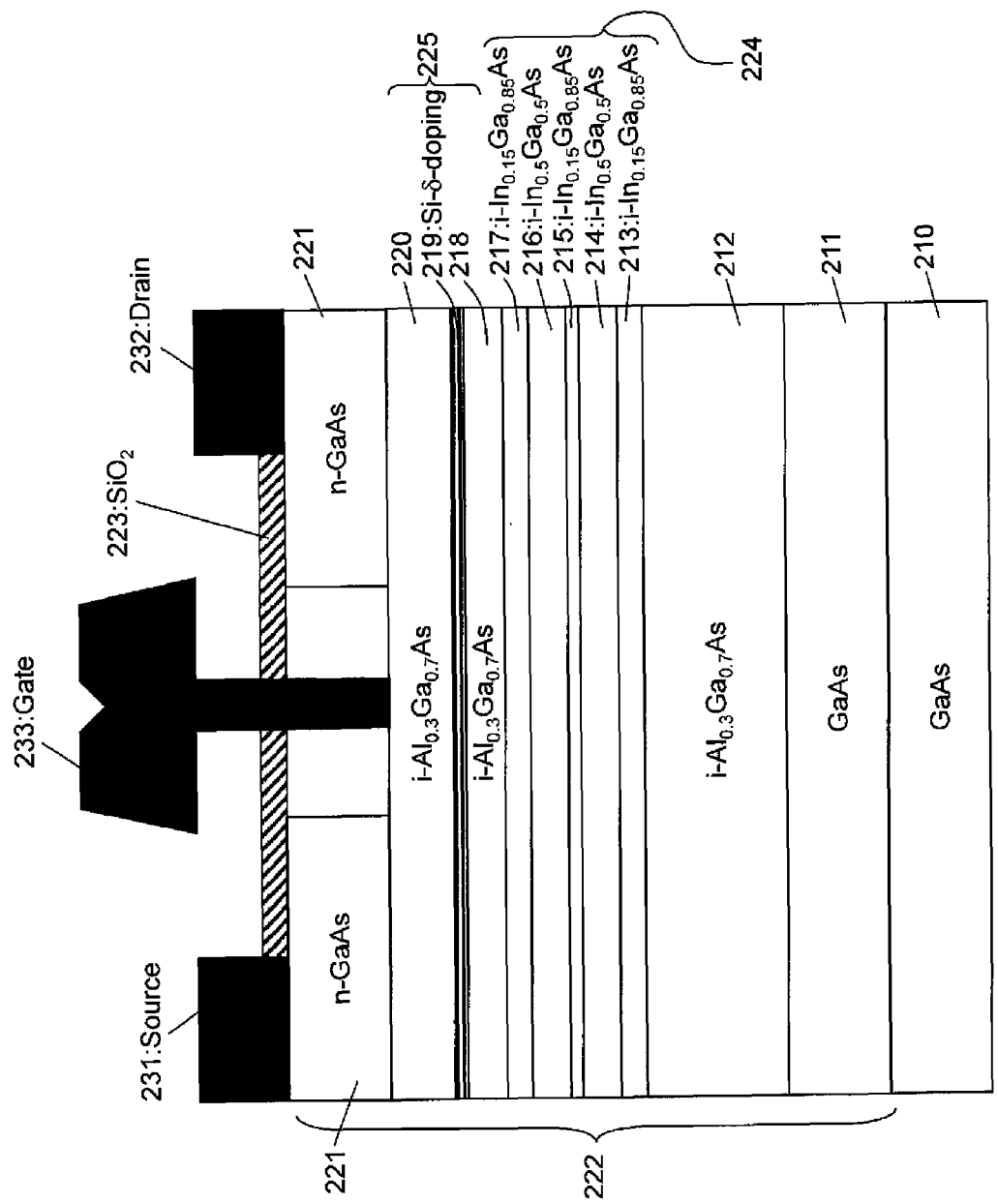
FIG. 23 is a schematic cross-sectional view illustrating the structure of a composite channel HEMT, wherein the first well layer and the second well layer include InGaAs that has a higher indium (In) content than that in InGaAs in the intermediate barrier layer.
Figure 24:
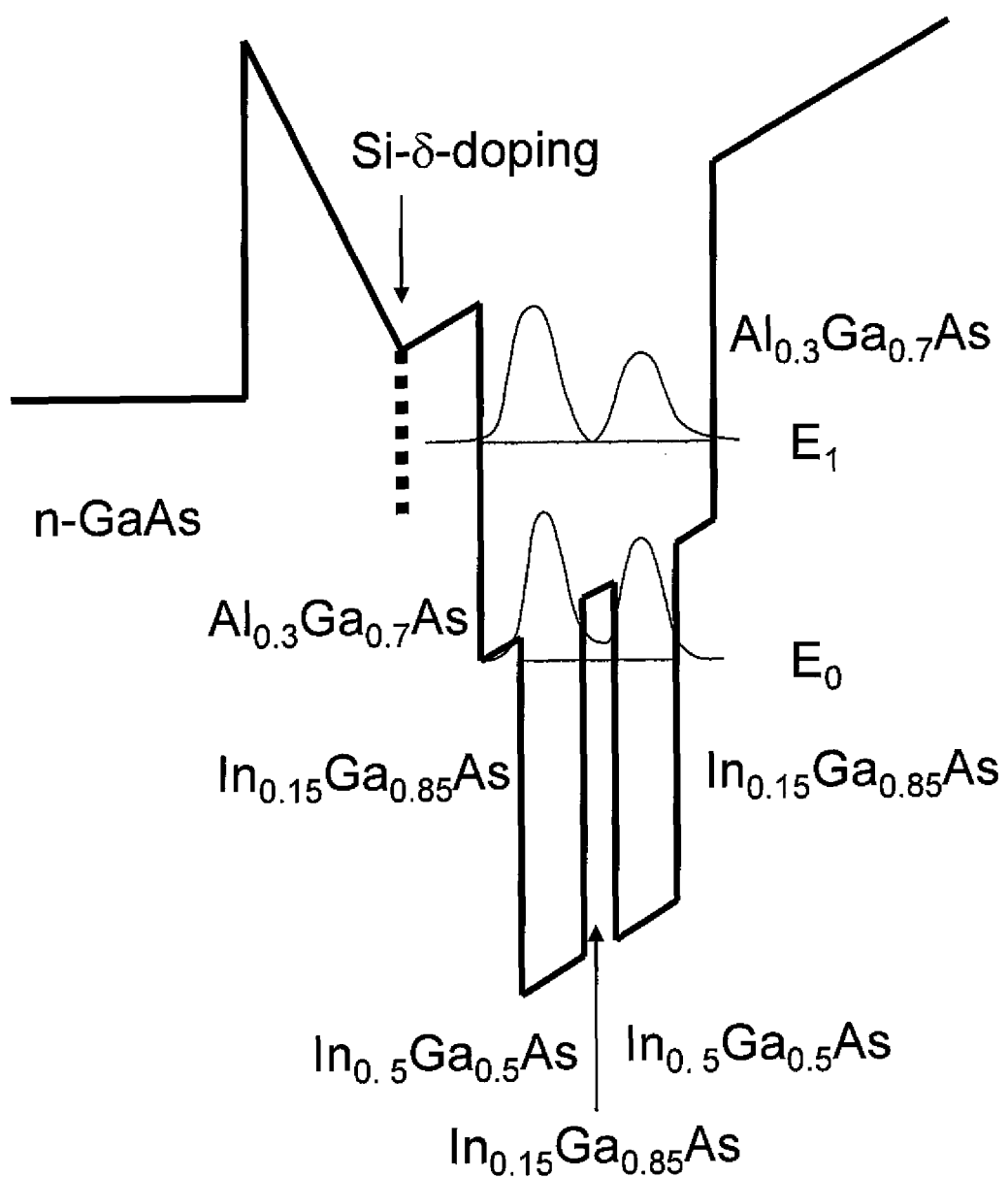
FIG. 24 is a schematic diagram illustrating the band structure of the conduction band in a composite channel HEMT, wherein the first well layer and the second well layer include InGaAs that has a higher indium (In) content than that in InGaAs in the intermediate barrier layer.

For example, the band structure of the conduction band in the vertical direction in an InGaAs/InAs/InGaAs composite channel HEMT structured as depicted in FIG. 21 is depicted in FIG. 22.

As depicted in FIG. 22, the ground level $E_0$ is generated in the InAs layer defining the quantum well layer, while the first excitation level $E_1$ is generated across the entire InGaAs/InAs/InGaAs quantum well layer defining the quantum well layer.

FIG. 22 also illustrates the electron distribution ($|$wave function$|^2$) in each of the ground level $E_0$ and the first excitation level $E_1$.

As depicted in FIG. 22, the electrons in the ground level $E_0$ exist having a single peak in the InAs layer, the electrons in the first excitation level $E_1$ exist across the entire InGaAs/InAs/InGaAs quantum well layer, having two peaks with a node near the center. In this case, the probability that electrons in the first excitation level $E_1$ exist in the InGaAs layer defining the quantum well layer is increased, which increases the effective mass of electrons, prohibiting a further increase in the speed of the HEMT.

Accordingly, it is necessary that many electrons as possible exist in a well layer where the effective mass of electrons decreases even when the percentage of electron in the first excitation level is increased, thereby further increasing the device speed.

Hereinafter, a semiconductor devices in accordance with embodiments of the prevent invention will be described with reference to the drawings.

[First Embodiment]

A semiconductor device in accordance with a first embodiment will be described with reference to FIGS. 1-6B.

A semiconductor device in accordance with this embodiment is an InP-based HEMT which is an ultra high-speed transistor used for telecommunications, for example. More specifically, this semiconductor device is an InP-based HEMT which includes an InP-based composition semiconductor, for example, and has a semiconductor stacked structure including an electron transit layer (channel layer) and an electron supply layer.

Figure 1:
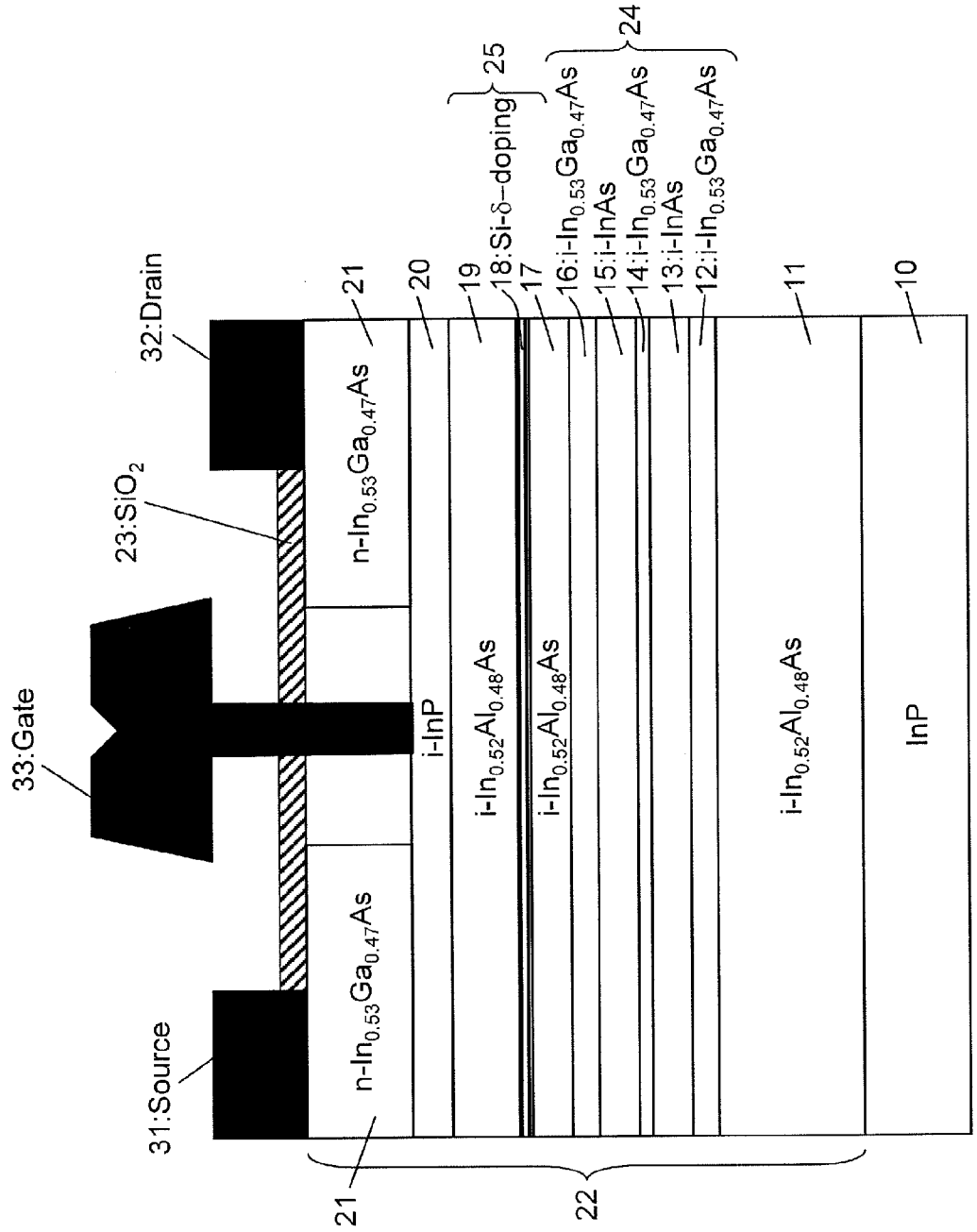
FIG. 1 is a schematic cross-sectional view illustrating the structure of a semiconductor device (composite channel InAs-based HEMT) in accordance with a first embodiment.

As depicted in FIG. 1, this InP-HEMT includes, a substrate 10, a semiconductor stacked structure 22 provided over the substrate 10, and a gate electrode 33, a source electrode 31, and a drain electrode 32, provided over the semiconductor stacked structure 22.

In the present embodiment, the substrate 10 is a semi-insulating InP substrate (semiconductor substrate). For example, the substrate 10 is a semi-insulating (100) InP substrate.

The semiconductor stacked structure 22 is a semiconductor stacked structure including an electron transit layer 24 and an electron supply layer 25. Here, the semiconductor stacked structure 22 has a structure where a buffer layer 11, an electron transit layer 24, an electron supply layer 25, an etching stop layer 20, and a cap layer 21 are sequentially stacked.

In this embodiment, the buffer layer 11 is an InAlAs layer. Here, the buffer layer 11 is an undoped InAlAs buffer layer. For example, the buffer layer 11 is an i-$In_{0.52}Al_{0.48}As$ buffer layer, having a thickness of about 200 nm.

The electron transit layer 24 is a dual quantum well layer having a structure where an InGaAs layer (lower barrier layer) 12, an InAs layer (first well layer) 13, an InGaAs layer (intermediate barrier layer) 14, an InAs layer (second well layer) 15, and an InGaAs layer (upper barrier layer) 16 are sequentially stacked. Here, the electron transit layer 24 is a dual quantum well layer having a structure where an undoped InGaAs layer 12, an undoped InAs layer 13, an undoped InGaAs layer 14, an undoped InAs layer 15, and an undoped InGaAs layer 16 are sequentially stacked. For example, the electron transit layer 24 is a dual quantum well layer having a structure where an i-$In_{0.53}Ga_{0.47}As$ layer 12, an i-InAs layer 13, an i-$In_{0.53}Ga_{0.47}As$ layer 14, an i-InAs layer 15, and an i-$In_{0.53}Ga_{0.47}As$ layer 16 are sequentially stacked. Here, the i-$In_{0.53}Ga_{0.47}As$ layer 12, the i-InAs layer 13, the i-$In_{0.53}Ga_{0.47}As$ layer 14, the i-InAs layer 15, and the i-$In_{0.53}Ga_{0.47}As$ layer 16 have thicknesses of about 2 nm, about 3 nm, about 2 nm, about 3 nm, and about 2 nm, respectively. Thus, the total thickness of the dual quantum well layer as the electron transit layer 24 is about 12 nm. Here, while $In_{0.53}Ga_{0.47}As$ which lattice-matches with InP is used for the upper barrier layer 16, the intermediate barrier layer 14, and the lower barrier layer 12 defining the electron transit layer 24, this is not limiting. For example, $In_{0.7}Ga_{0.3}As$ which provides a smaller effective mass of electrons (the effective mass of the electron in the Γ valley) may also be used for these layers.

Note that such a dual quantum well layer is referred to as an InGaAs/InAs/InGaAs/InAs/InGaAs dual quantum well layer. Further, such an electron transit layer is referred to as an InGaAs/InAs/InGaAs/InAs/InGaAs electron transit layer, or an InGaAs/InAs/InGaAs/InAs/InGaAs composite channel. Further, a HEMT including an InGaAs/InAs/InGaAs/InAs/InGaAs electron transit layer is referred to as an InGaAs/InAs/InGaAs/InAs/InGaAs composite channel HEMT, five-layered composite channel HEMT, or InGaAs/InAs/InGaAs/InAs/InGaAs five-layered composite channel HEMT.

The electron supply layer 25 has a structure where an InAlAs spacer layer 17, an Si-δ-doping layer 18, and an InAlAs barrier layer 19 are sequentially stacked. Here, the electron supply layer 25 has a structure where an undoped InAlAs spacer layer 17, an Si-δ-doping layer 18 formed from InAlAs provided with an n-type conductivity by δ-doping Si, and an undoped InAlAs barrier layer 19 are sequentially stacked. For example, the electron supply layer 25 has a structure where an i-In$_{0.52}$Al$_{0.48}$As spacer layer 17 having a thickness of about 3 nm, an Si-δ-doping layer 18 with an Si-δ-dope level of about $1 \times 10^{13}$ cm$^{-2}$, and an i-In$_{0.52}$Al$_{0.48}$As barrier layer 19 having a thickness of about 6 nm, are sequentially stacked.

Note that such an electron supply layer 25 is referred to as an InAlAs/Si-δ-doping/InAlAs electron supply layer. The electron supply layer 25 may be an InAlAs layer provided with an n-type conductivity (n-type InAlAs layer) by doping Si, or an InAlAsSb layer provided with an n-type conductivity (n-type InAlAsSb layer) by doping Si.

The etching stop layer 20 is an InP layer. Here, the etching stop layer 20 is an undoped InP layer, i.e., an i-InP layer, having a thickness of about 3 nm.

The cap layer 21 is an InGaAs layer. Here, the cap layer 21 is an n-InGaAs cap layer provided with an n-type conductivity by doping Si. For example, the cap layer 21 is an n-In$_{0.53}$Ga$_{0.47}$As cap layer having a thickness of about 20 nm and an Si-doping level ($N_D$) of about $2 \times 10^{19}$ cm$^{-3}$. Note that the cap layer 21 may have a dual-layer structure wherein an n-In$_{0.70}$Ga$_{0.30}$As cap layer is stacked over an n-In$_{0.53}$Ga$_{0.47}$As cap layer.

The semiconductor stacked structure 22 may be any structure including an electron transit layer 24 and an electron supply layer 25, and may have a different stacked structure. The semiconductor stacked structure 22 is referred to as a hetero structure semiconductor layer. In this embodiment, the buffer layer 11 provided over the substrate 10, and contacting the bottom of the electron transit layer 24 is also referred to as a first semiconductor layer. The spacer layer 17 (electron supply layer 25) contacting the top of the electron transit layer 24 is also referred to as second semiconductor layer. The buffer layer 11 and the spacer layer 17 are also referred to as barrier layers over and under the electron transit layer 24. The dual quantum well layer as the electron transit layer 24 is also referred to as a dual quantum well layer having a structure where a first well layer, an intermediate barrier layer, and the second well layer 15 are sequentially stacked.

A gate electrode 33, a source electrode 31, and a drain electrode 32 are provided over the semiconductor stacked structure 22 structured as set forth above, the surface of which is covered with an SiO$_2$ film (insulation film) 23.

In this embodiment, the source electrode 31 and the drain electrode 32, made from Ti/Pt/Au, for example, are provided over the n-InGaAs cap layer 21. Further, the gate electrode 33 is provided over the i-InP layer 20, made from Ti/Pt/Au, for example.

In this embodiment, considering the profile (electron distributions) of the wave function in each of the quantum levels generated in the electron transit layer 24 due to two-dimensional confinement of electrons, the electron transit layer 24 is formed as a dual quantum well layer including two well layers, as set forth above. In other words, this embodiment employs a dual quantum well layer in a five-layer structure of InGaAs/InAs/InGaAs/InAs/InGaAs, as a composite channel.

Figure 2:
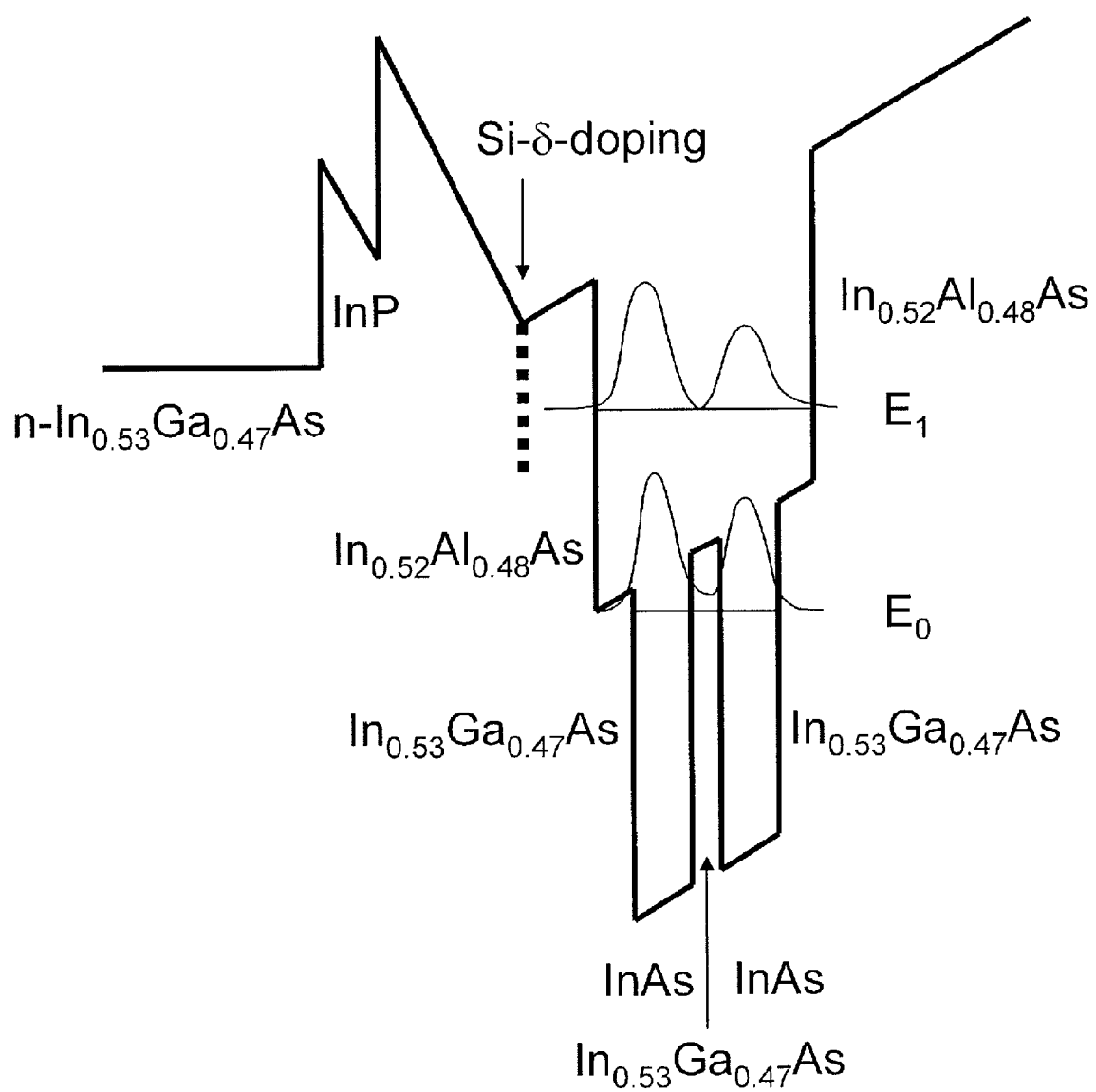
FIG. 2 is a schematic diagram illustrating the band structure of the conduction band in the semiconductor device (composite channel InAs-based HEMT) in accordance with the first embodiment.

Here, FIG. 2 is a schematic diagram illustrating the band structure of the conduction band in the vertical direction of the InGaAs/InAs/InGaAs/InAs/InGaAs composite channel HEMT.

Since this embodiment is structured as set forth above, the energy of the conduction band of the barrier layers (InGaAs layers) 12, 14, and 16 defining the electron transit layer 24 is lower than the energy of the conduction band of the InAlAs buffer layer (first semiconductor layer) 11 and the InAlAs spacer layer (second semiconductor layer) 17 contacting the top and bottom of the electron transit layer 24, as depicted in FIG. 2, defining a quantum well structure. Further, the energy of the conduction band of the well layers (InAs layers) 13 and 15 defining the electron transit layer 24 is lower than the energy of the conduction band of the barrier layers (InGaAs layers) 12, 14, and 16 contacting the tops and bottoms of the well layers 13 and 15, defining a quantum well structure. In this manner, in the barrier layers 12, 14, and 16 defining the electron transit layer 24 and the quantum well structure formed from the InAlAs buffer layer 11 and the InAlAs spacer layer 17, a second quantum well structure formed from the well layers 13 and 15 and the barrier layers 12, 14, and 16 defining the electron transit layer 24 is provided (here, dual quantum well structure). Note that such an electron transit layer 24 is referred to as a double well composite channel layer.

Further, in this embodiment, as set forth above, the total thickness of the electron transit layer 24 is about 12 nm, two or three quantum levels is formed in the electron transit layer 24 due to the two-dimensional confinement of electrons. Additionally, since the InGaAs layer as the intermediate barrier layer 14 has a smaller thickness of about 2 nm or smaller, for example, the two InAs layers as the well layers 13 and 15 quantum-mechanically combine with each other.

As a result, as depicted in FIG. 2, the ground level $E_0$ is generated in the InAs layers, as the two well layers 13 and 15 defining the electron transit layer 24, while the first excitation level $E_1$ is generated in the dual quantum well layer as the electron transit layer 24. In other words, the ground level $E_0$ is generated in the two InAs layers 13 and 15 that quantum-mechanically combine with each other, while the first excitation level $E_1$ is generated across the entire InGaAs/InAs/InGaAs/InAs/InGaAs dual quantum well layer 24.

FIG. 2 also illustrates the electron distribution (|wave function|$^2$) in each of the ground level $E_0$ and the first excitation level $E_1$.

As depicted in FIG. 2, electrons in the ground level $E_0$ dominantly exist in the InAs layers 13 and 15 and have two peaks since the existence probability of electrons in the part of the InGaAs layer 14 is reduced, due to the InGaAs layer 14 having a higher potential located at the center therebetween. Unlike the wave function of the first excitation level $E_1$, however, the wave function of the ground level $E_0$ does not have a node at the center. In other words, since electrons do not exist having two peaks with a node near the center, the first excitation level $E_1$ is not generated in the InAs layers as the two well layers 13 and 15. Additionally, since the two peaks are continuous, not being separated from each other, the two InAs layers 13 and 15 quantum-mechanically combine with each other. In such a case, because of the layer structure of the dual quantum well layer 24, electrons in the ground level $E_0$ exist, having a single peak in each of the two InAs layers 13 and 15, and the existence probability is increased in the two InAs layers 13 and 15.

In contrast, electrons in the first excitation level $E_1$ exist with two peaks across the entire InGaAs/InAs/InGaAs/InAs/InGaAs dual quantum well layer 24, with a node near the center. In other words, since electrons exist having two peaks with a node near the center, the first excitation level $E_1$ is generated in the InGaAs/InAs/InGaAs/InAs/InGaAs dual quantum well layer 24. In such a case, because of the layer structure of the dual quantum well layer 24, electrons in the first excitation level $E_1$ exist, having a single peak in each of the two InAs layers 13 and 15, and the existence probability is increased in the two InAs layers 13 and 15.

If the two InAs layers 13 and 15 do not quantum-mechanically combine with each other, the respective quantum levels are generated in the InAs layers 13 and 15, which are the ground level $E_0$ and the first excitation level $E_1$. Hence, the quantum level in the dual quantum well layer 24 is the second excitation level $E_2$ in which electrons exist having three peaks, and the existence probability of electrons in the two InAs layers 13 and 15 cannot be increased.

Accordingly, the probability that electrons exist in the InAs layers (well layers) 13 and 15 where the effective mass of the electrons (effective mass of the electrons in the ⌈ valley) is reduced both at the ground level $E_0$ and the first excitation level $E_1$ is increased, which reduces the electrons existing in the InGaAs layers (barrier layers) 12, 14, and 16 where the effective mass of the electrons (effective mass of the electrons in the ⌈ valley) is increased thereby further increasing the device speed. A quantum mechanical calculation reveals that about 80% or more electrons (e.g., about 85% of electrons) can place in the InAs layers 13 and 15 even in the first excitation level $E_1$ in a HEMT structured as set forth above, thereby further increasing the device speed A possible increase in the device speed is estimated as follows.

In an InGaAs/InAs/InGaAs composite channel HEMT having a single quantum well layer including the above-described single well layer, about 90% of electrons exist in the InGaAs layer, whereas about 10% of electron exists in the InAs layer, in the first excitation level $E_1$.

In contrast, in an InGaAs/InAs/InGaAs/InAs/InGaAs composite channel HEMT having a dual quantum well layer in accordance with the present embodiment, about 15% of electrons exist in the InGaAs layer, whereas about 85% of electron exists in the InAs layer, in the first excitation level $E_1$.

The intrinsic cut-off frequency $F_T$ of the HEMT is expressed in the following Eq. (1):

$$f_T = \frac{v}{2\pi L_g} = \frac{1}{2\pi L_g} \frac{\hbar k}{m^*} \propto \frac{1}{m^*} \quad (1)$$

where v represent the electron velocity, $L_g$ represents the gate length, $\hbar$ represents h/2π (h is the Planck constant), k is the wave number of electrons, and m* is the effective mass of electrons.

As described above, since the intrinsic cut-off frequency $f_T$ is proportional to the reciprocal of m*, the ratio of fTDW of the HEMT having a dual quantum well layer to fTSW of the HEMT having a single quantum well layer is expressed in the following Eq. (2), indicating that a 65% increase about will be achieved in the HEMT having a dual quantum well layer.

$$\frac{f_T^{DW}}{f_T^{SW}} = \frac{0.15/0.043 + 0.85/0.022}{0.9/0.043 + 0.1/0.022} \cong \frac{42.13}{25.48} \cong 1.65 \quad (2)$$

By adjusting the thicknesses of the well layers 13 and 15, and the barrier layers 12, 14, and 16 defining the dual quantum well layer 24, considering the profile of the wave function, a further increased rate of increase may possibly be achieved.

Hereinafter, a method for manufacturing the semiconductor device (InP-based HEMT) in accordance with this embodiment will be explained with reference to FIGS. 3A-6B.

Figure 3A:
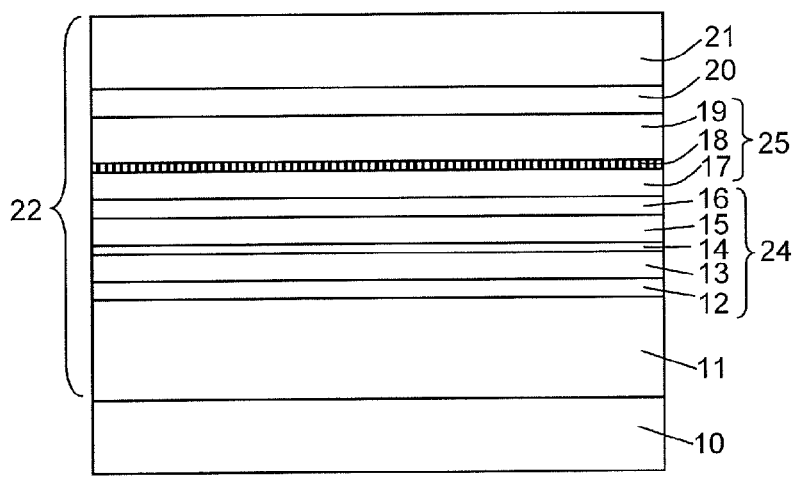
FIGS. 3A to 3C are schematic cross-sectional views illustrating a method of manufacturing the semiconductor device (composite channel InAs-based HEMT) in accordance with the first embodiment.

Firstly, as depicted in FIG. 3A, over a semi-insulating InP substrate 10, an i-$In_{0.52}Al_{0.48}As$ buffer layer 11; an i-$In_{0.53}Ga_{0.47}As$ barrier layer 12, an i-InAs well layer 13, an i-$In_{0.53}Ga_{0.47}As$ barrier layer 14, an i-InAs well layer 15, and an i-$In_{0.53}Ga_{0.47}As$ barrier layer 16 defining an electron transit layer 24; an i-$In_{0.52}Al_{0.48}As$ spacer layer 17, an Si-δ-doping layer 18, and an i-$In_{0.52}Al_{0.48}As$ barrier layer 19 defining an electron supply layer 25; an i-InP the etching stop layer 20; and an n-$In_{0.53}Ga_{0.47}As$ cap layer 21 are sequentially stacked with molecular beam epitaxy (MBE), to form a semiconductor stacked structure 22.

Here, the i-$In_{0.52}Al_{0.48}As$ buffer layer 11 is formed with a thickness of about 200 nm. The i-$In_{0.53}Ga_{0.47}As$ barrier layer 12, the i-$In_{0.53}Ga_{0.47}As$ barrier layer 14, and the i-$In_{0.53}Ga_{0.47}As$ barrier layer 16 are formed with a thickness of about 2 nm. The i-InAs well layer 13 and the i-InAs well layer 15 are formed with a thickness of about 3 nm. The i-$In_{0.52}Al_{0.48}As$ spacer layer 17 is formed with a thickness of about 3 nm. The Si-δ-doping layer 18 is δ-doped with an Si-δ-doping level of about $1 \times 10^{13}$ cm$^{-2}$. The i-$In_{0.52}Al_{0.48}As$ barrier layer 19 is formed with a thickness of about 6 nm. The i-InP etching stop layer 20 is formed with a thickness of about 3 nm. The n-$In_{0.53}Ga_{0.47}As$ cap layer 21 is formed with a thickness of about 20 nm and an Si-doping level of about $2 \times 10^{19}$ cm$^{-3}$.

Figure 3B:
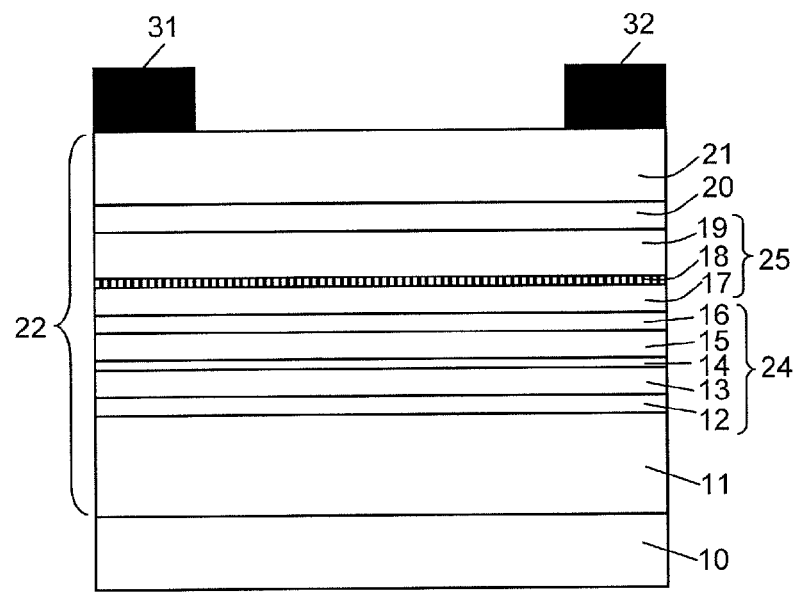

Next, after element isolation, as depicted in FIG. 3B a source electrode 31 and a drain electrode 32 of a Ti/Pt/Au three-layer structure, for example, are formed. Thereby, the source electrode 31 and the drain electrode 32 are formed over the n-$In_{0.53}Ga_{0.47}As$ cap layer 21.

Figure 3C:
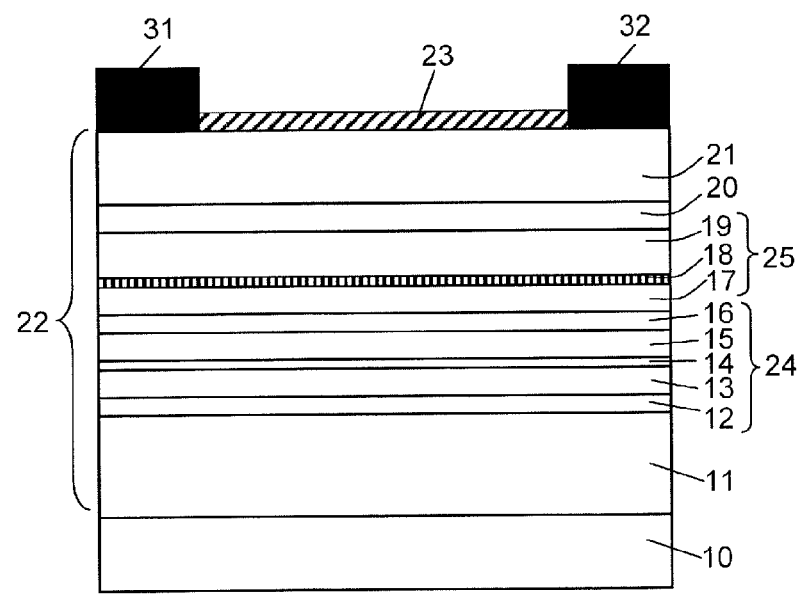

Next, as depicted in FIG. 3C, an SiO$_2$ film 23 is formed with plasma-enhanced chemical vapor deposition (CVD), for example, over the n-$In_{0.53}Ga_{0.47}As$ cap layer 21 between the source electrode 31 and the drain electrode 32. Here, the SiO$_2$ film 23 is formed with a thickness of about 20 nm.

Next, as depicted in FIGS. 4A to 6B, a T-type gate electrode 33 is formed.

Figure 4A:
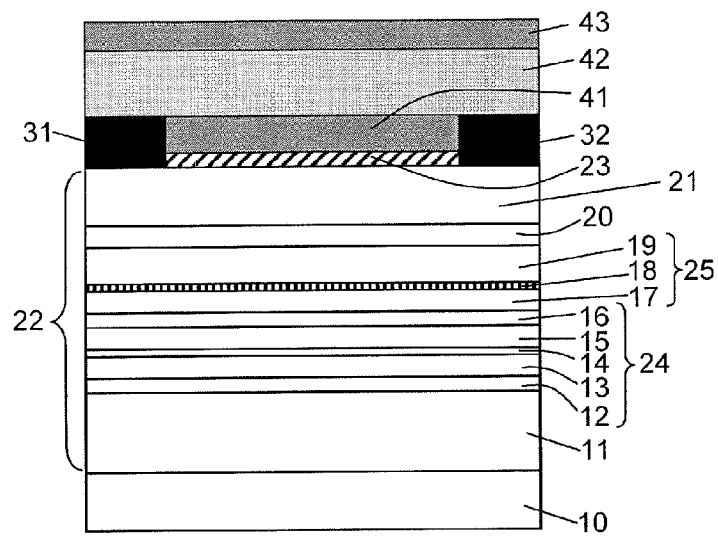
FIGS. 4A to 4C are schematic cross-sectional views illustrating the method of manufacturing the semiconductor device (composite channel InAs-based HEMT) in accordance with the first embodiment.

More specifically, firstly, as depicted in FIG. 4A, three-layer resist films 41-43 are formed. Here, a ZEP resist (manufactured from Zeon Corporation, Japan), a poly-dimethylglutarimide (PMGI) resist, and the ZEP resist are sequentially applied, to form three-layer resist films wherein a ZEP resist film 41, a PMGI resist film 42, and a ZEP resist film 43 are sequentially stacked.

Figure 4B:
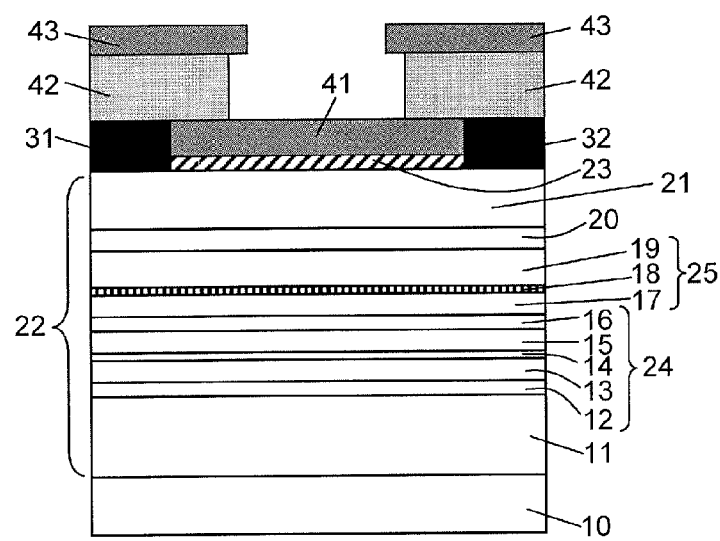
Figure 4C:
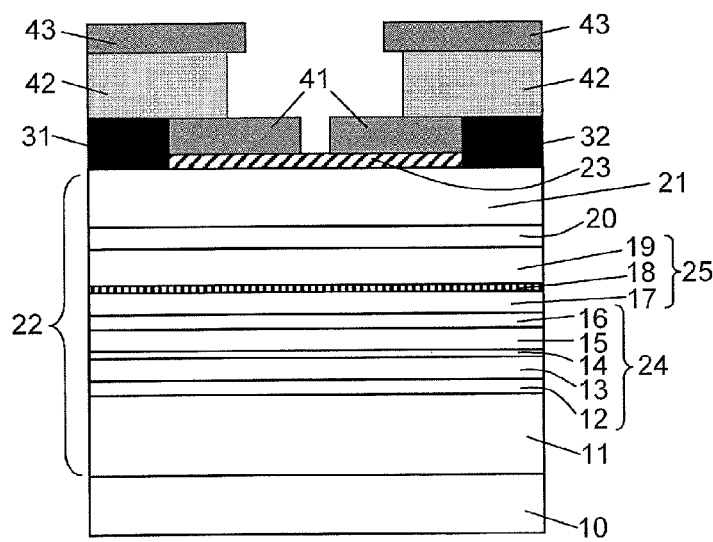

Next, as depicted in FIG. 4B, the region defining a head portion of the T-type gate electrode 33 is exposed with electron beam exposure, for example, to define an opening in the ZEP resist film 43 and the PMGI resist film 42. As depicted in FIG. 4C, the region defining a foot portion of the T-type gate electrode 33 is exposed with electron beam exposure, for example, to define an opening in the bottommost ZEP resist film 41, which is sized correspondingly to a desired gate length.

Figure 5A:
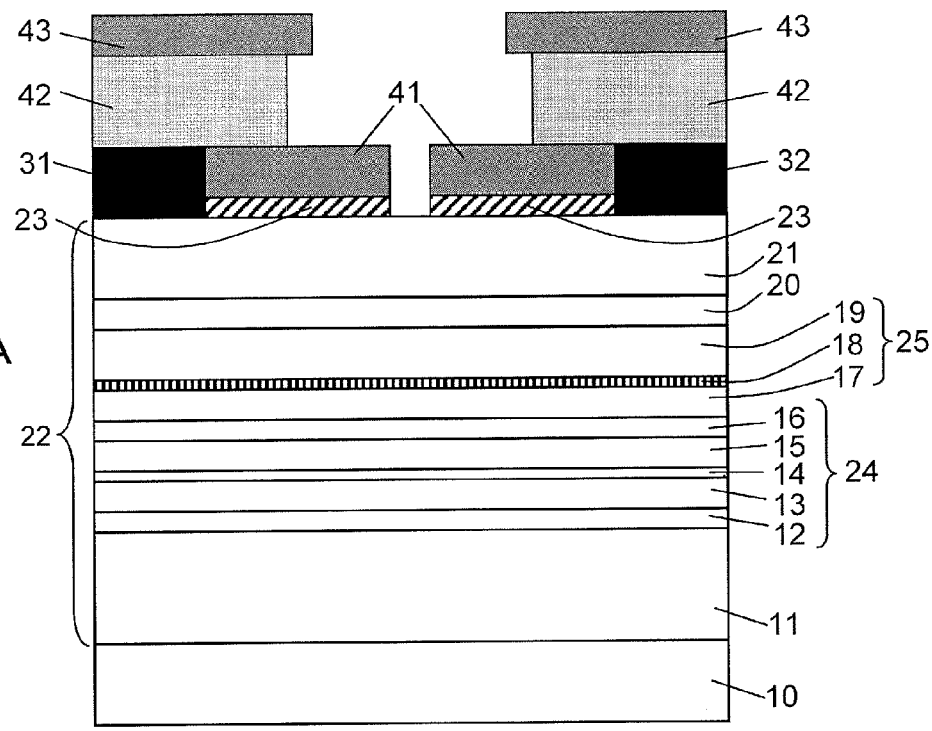
FIGS. 5A and 5B are schematic cross-sectional views illustrating the method of manufacturing the semiconductor device (composite channel InAs-based HEMT) in accordance with the first embodiment.

Next, using the bottommost ZEP resist film 41 having the opening sized correspondingly to the desired gate length formed therein, as a mask, an opening is defined in the $SiO_2$ film 23 with reactive ion etching using $CF_4$ as an etching gas, for example, as depicted in FIG. 5A.

Figure 5B:
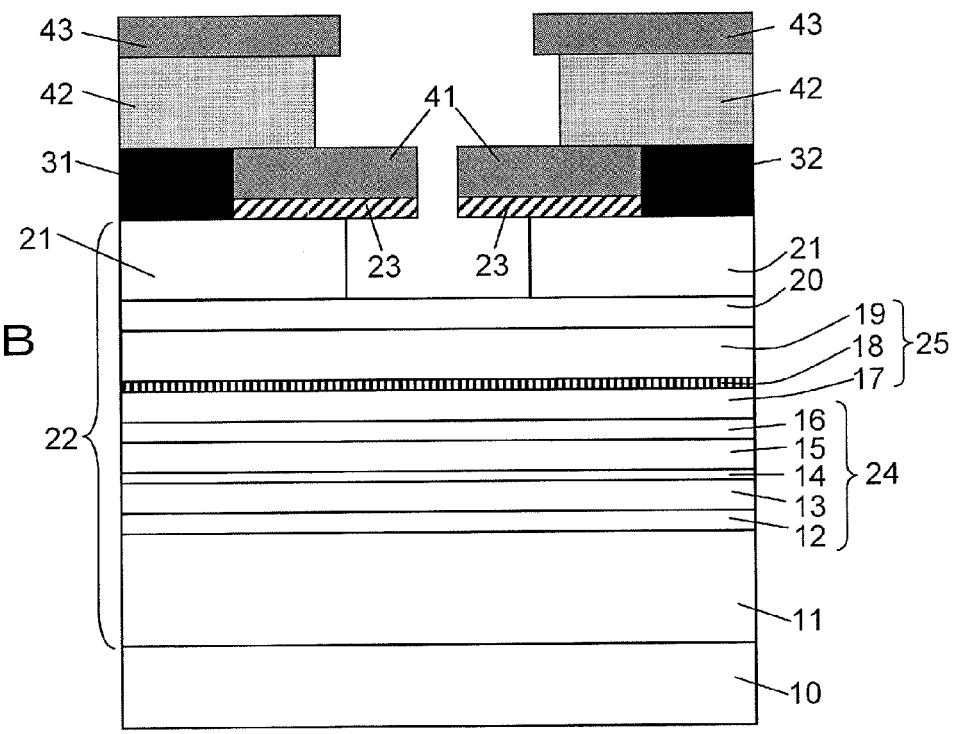

In order to electrically isolate the n-type $In_{0.53}Ga_{0.47}As$ cap layer 21, a recess is then formed in an wet etching using a solution mixture of citric acid ($C_6H_8O_7$) and hydrogen peroxide solution ($H_2O_2$) as an etching solution, for example, as depicted in FIG. 5B.

Figure 6A:
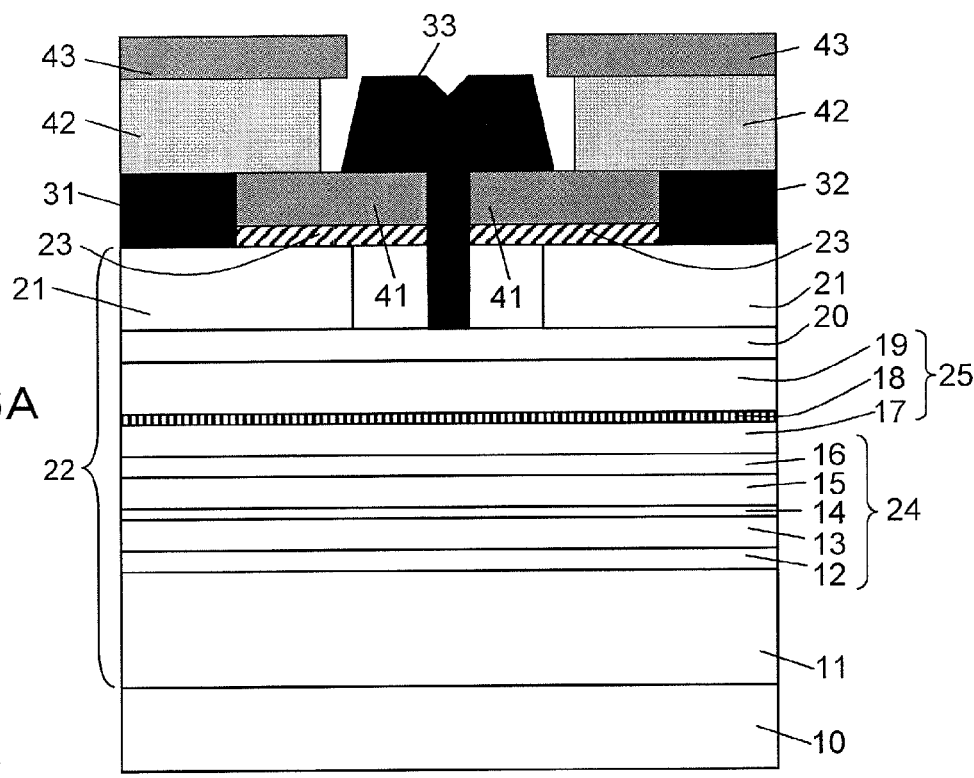
FIGS. 6A and 6B are schematic cross-sectional views illustrating the method of manufacturing the semiconductor device (composite channel InAs-based HEMT) in accordance with the first embodiment.
Figure 6B:
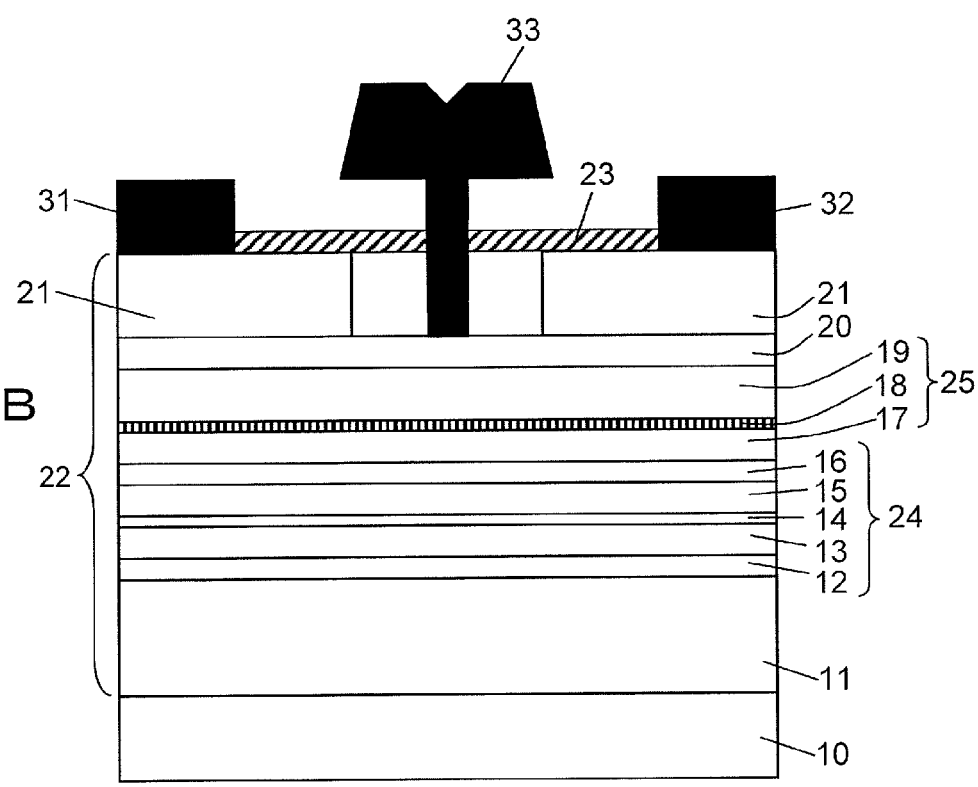

Finally, as depicted in FIGS. 6A and 6B, after evaporating Ti, Pt, and Au, for example, a T-type gate electrode 33 of a Ti/Pt/Au three-layer structure is formed by lift-off, for example. Thereby, the T-type gate electrode 33 is formed over the i-InP etching stop layer 20.

As described above, since the InGaAs/InAs/InGaAs/InAs/InGaAs composite channel HEMT in this embodiment has the same structure as those of typical InP-based HEMTs except for the channel, it can be fabricated in the same processes as well-established processes for manufacturing InP-based HEMTs. In other words, ultra high-speed HEMTs which are well advanced to typical InP-based HEMTs can be achieved in the same processes as those for typical InP-based HEMTs.

In order to further increasing the speed of a HEMT, InAs or InSb which have an even smaller effective mass of electron may be used as the channel material.

For example, the effective mass of electrons in the Γ valley is about $0.043m_e$, about $0.036m_e$, about $0.033m_e$, about $0.022m_e$, and about $0.014m_e$ in $In_{0.53}Ga_{0.47}As$, $In_{0.7}Ga_{0.3}As$, $In_{0.75}Ga_{0.25}As$, InAs, and InSb, respectively, where $m_e$ represents the rest mass of electrons.

Hence, a tera hertz band operation may possibly be achieved, when InAs or InSb is used as the channel material, thereby further increasing the electron velocity. For example, for InAs as the channel material, AlSb, AlGaSb, or AlAsSb is used as a barrier layer for confining electrons. For example, for InSb as the channel material, InAlSb is used as a barrier layer for confining electrons.

However, since crystal growth and microfabrication techniques are not well established for HEMTs including InAs or InSb as those for InP-based HEMTs, an expected speed increase has not been achieved yet.

Against such a background, as set forth above, an InGaAs/InAs/InGaAs/InAs/InGaAs composite channel HEMT is used, while utilizing fabrication techniques for InP-based HEMTs, thereby providing a further speed enhancement.

Accordingly, the semiconductor device in accordance with this embodiment is advantageous in that many electrons as possible exist in the InAs well layer where the effective mass of electrons decreases even when the percentage of electron in the first excitation level $E_1$ is increased, thereby further increasing the device speed.

Note that the structure and the method of manufacturing the InP-based HEMT are not limited to those in the above-described embodiment. Any InP-based HEMTs may be possible, which include a first semiconductor layer provided over a substrate; an electron transit layer contacting a top of the first semiconductor layer; and a second semiconductor layer contacting a top of the electron transit layer, wherein the electron transit layer has a dual quantum well layer having a structure where a first well layer, an intermediate barrier layer, and a second well layer are sequentially stacked, an energy of a conduction band of the intermediate barrier layer is lower than an energy of conduction band of the first semiconductor layer and the second semiconductor layer, and a ground level is generated in the first and second well layers, and a first excitation level is generated in the dual quantum well layer. In other words, any InP-based HEMTs may be used, which includes a dual quantum well layer having two well layers quantum-mechanically combining with each other, and first and second semiconductor layers contacting the top and bottom of the dual quantum well layer and having a higher energy of the conduction band than that of the intermediate barrier layer in the dual quantum well layer.

Figure 7:
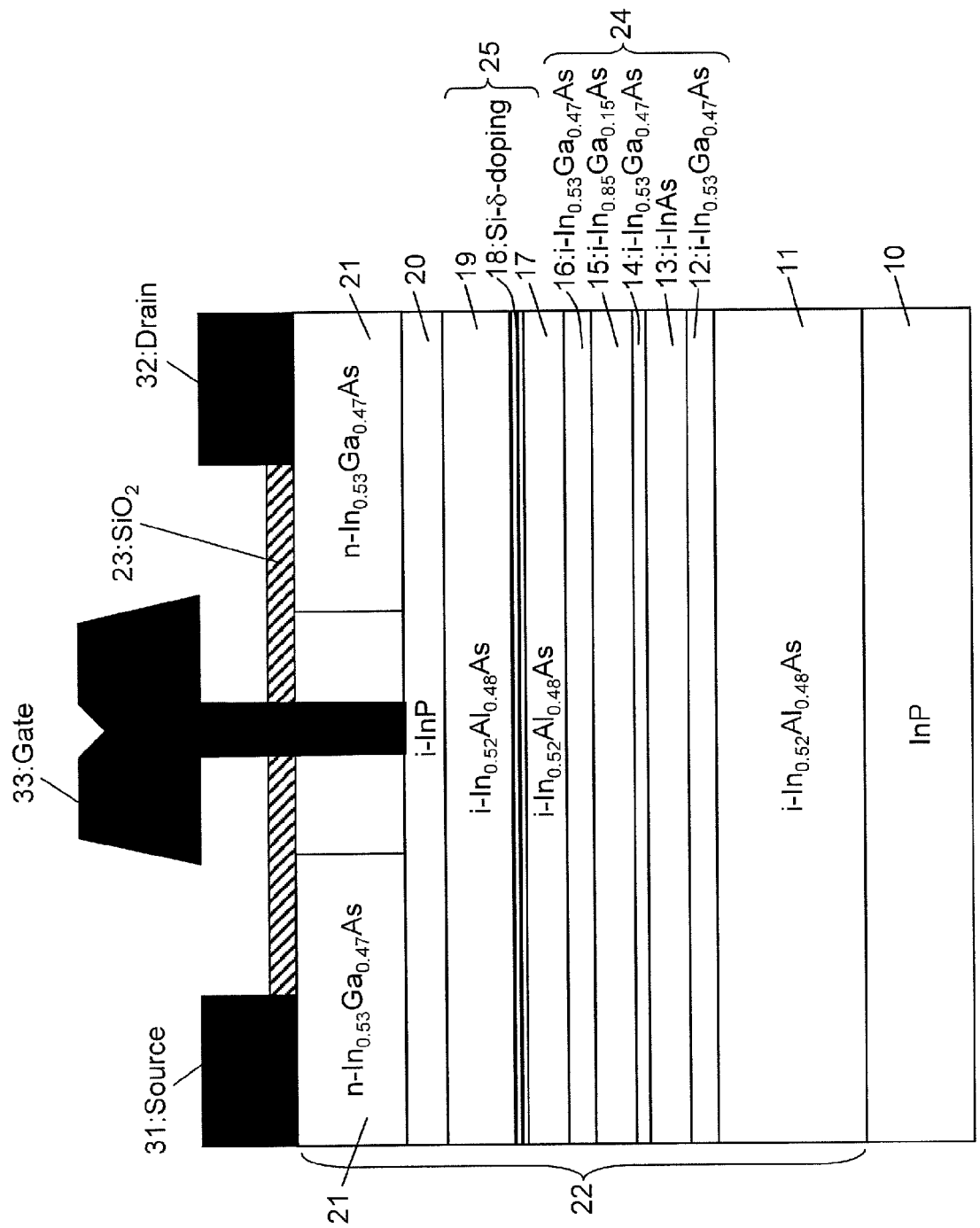
FIG. 7 is a schematic cross-sectional view illustrating the structure of a semiconductor device (composite channel InAs-based HEMT) in accordance with a first modification to the first embodiment.
Figure 8:
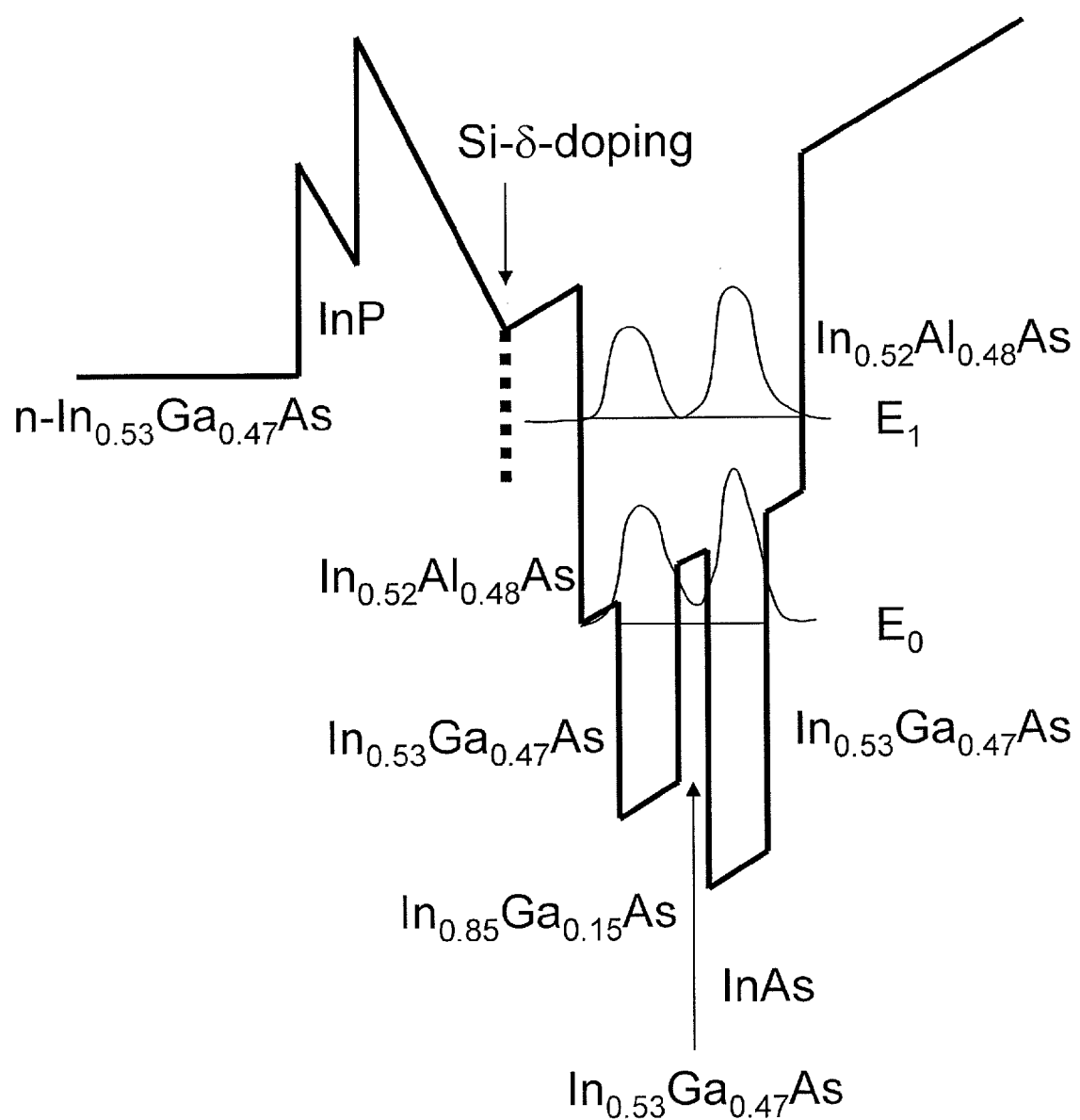
FIG. 8 is a schematic diagram illustrating the band structure of the conduction band in the semiconductor device (composite channel InAs-based HEMT) in accordance with the first modification to the first embodiment.

For example, although the InGaAs/InAs/InGaAs/InAs/InGaAs dual quantum well layer 24 is used for the composite channel and the compositions in the barrier layers 12, 14, and 16 are adjusted in the above-described embodiment, the material and compositions are not limited to those in the above-described embodiment as long as a dual quantum well structure are provided which have the two well layers 13 and 15 quantum-mechanically combining with each other. More specifically, for forming a dual quantum well layer by sequentially stacking a lower barrier layer, a first well layer, an intermediate barrier layer, a second well layer, and an upper barrier layer, the materials and the compositions of the barrier layers and the well layers may be determined such that the energy of the conduction band of the materials forming the first and second well layer becomes lower than the energy of the conduction band of the materials forming the lower barrier layer, the intermediate barrier layer, and the upper barrier layer, and the thickness of the intermediate barrier layer may be determined such that the two well layers quantum-mechanically combine with each other. For example, InGaAs may be used for all of the lower barrier layer, the first well layer, the intermediate barrier layer, the second well layer, and the upper barrier layer, and the compositions of InGaAs forming the barrier layers and the well layers may be adjusted such that the energy of the conduction band of InGaAs forming the first and second well layers becomes lower than the energy of the conduction band of InGaAs forming the lower barrier layer, the intermediate barrier layer, and the upper barrier layer. More specifically, when sequentially stacking an $In_{x1}Ga_{1-x1}As$ layer, an $In_{x2}Ga_{1-x2}As$ layer, an $In_{x3}Ga_{1-x3}As$ layer, an $In_{x4}Ga_{1-x4}As$ layer, and an $In_{x5}Ga_{1-x5}As$ layer, a dual quantum well structure is established if x2>max (x1, x3) and x4>max (x3, x5) stand, where max (xm, xn) gives the higher one of the compositions xm and xn. For example, the sequential stack of an $In_{0.53}Ga_{0.47}As$ layer (lower barrier layer) 12, an InAs layer (first well layer) 13, an $In_{0.53}Ga_{0.47}As$ layer (intermediate barrier layer) 14, an $In_{0.85}Ga_{0.15}As$ layer (second well layer) 15, and an $In_{0.53}Ga_{0.47}As$ layer (upper barrier layer) 16 as depicted in FIG. 7 satisfies the above condition, and a dual quantum well structure is established. The cross-section of a HEMT including such a dual quantum well layer 24 as an electron transit layer is depicted in FIG. 7, and the band structure of the conduction band in the vertical direction is depicted in FIG. 8. This HEMT is referred to as an InGaAs/$In_{0.05}Ga_{0.15}As$/InGaAs/InAs/InGaAs composite channel HEMT. This is also referred to as a first modification. Similar to the above-described embodiment, also in this modification, the probability that electrons exist in the $In_{0.85}Ga_{0.15}As$ and InAs layers (well layers) 13 and 15 where the effective mass of the electrons (effective mass of the electrons in the Γ valley) is reduced both at the ground level $E_0$ and the first excitation level $E_1$ is increased, which reduces the electrons existing in the $In_{0.53}Ga_{0.47}As$ layers (barrier layers) 12, 14, and 16 where the effective mass of the electrons (effective mass of the electrons in the Γ valley) is increased thereby further increasing the device speed.

As described above, the first well layer 13 and the second well layer 15 may have a higher In content (composition of InAs) than that in the intermediate barrier layer 14. For example, the first well layer 13 and the second well layer 15 may be InGaAs layers having a higher In content than InGaAs forming the intermediate barrier layer 14.

Alternatively, while the first well layer 13 and the second well layer 15 are semiconductor layers of the same material and composition in the above-described embodiment, the first well layer 13 and the second well layer 15 may be semiconductor layers of different materials as in the above-described modification. Alternatively, the first well layer 13 and the second well layer 15 may be semiconductor layers of the same material but different compositions. For example, the first well layer 13 and the second well layer 15 may be InGaAs layers of different compositions. As described above, the first well layer 13 and the second well layer 15 may be semiconductor layers of different materials and compositions.

Further, although the lower barrier layer 12, the intermediate barrier layer 14, and the upper barrier layer 16 are semiconductor layers of the same material and composition in the above-described embodiment and modification thereof, this is not limiting and the lower barrier layer 12, the intermediate barrier layer 14, and the upper barrier layer 16 may be semiconductor layers of different materials and compositions. More specifically, although the lower barrier layer 12, the intermediate barrier layer 14, and the upper barrier layer 16 are InGaAs layers of the same composition in the above-described embodiment and modifications thereof, this is not limiting and the lower barrier layer 12, the intermediate barrier layer 14, and the upper barrier layer 16 may be InGaAs layers of the same composition. Alternatively, the lower barrier layer 12, the intermediate barrier layer 14, and the upper barrier layer 16 may be semiconductor layers of different materials. For example, the lower barrier layer 12, the intermediate barrier layer 14, and the upper barrier layer 16 may be semiconductor layers including any material of InP that lattice-match with $In_{0.53}Ga_{0.47}As$ and $In_{0.53}Ga_{0.47}As$. In this case, the energy of the conduction band in the InP layer become lower than that of the $In_{0.52}Al_{0.45}As$ layer and higher than that of the $In_{0.53}Ga_{0.47}As$ layer.

Figure 9:
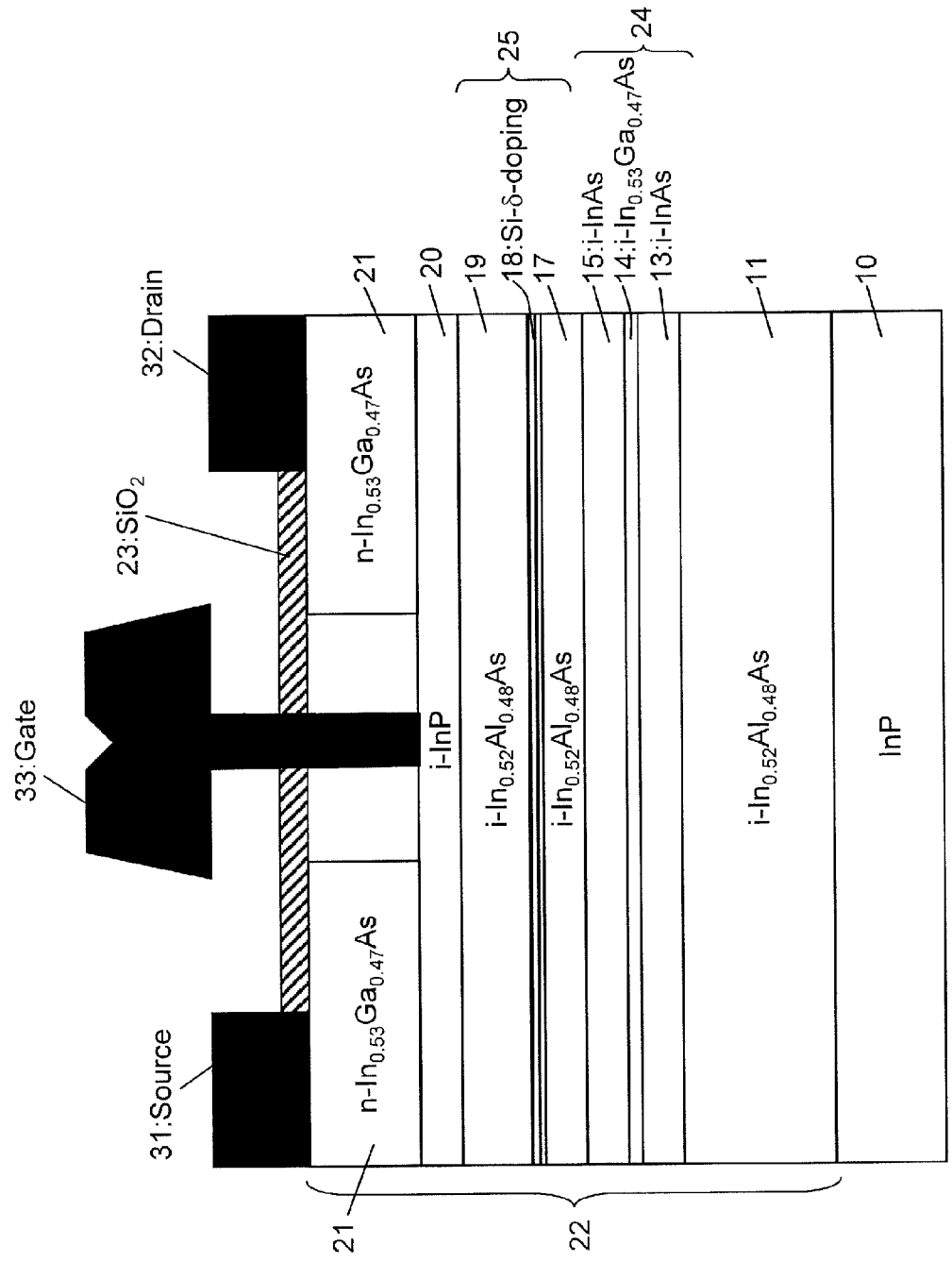
FIG. 9 is a schematic cross-sectional view illustrating the structure of a semiconductor device (composite channel InAs-based HEMT) in accordance with a second modification to the first embodiment.
Figure 10:
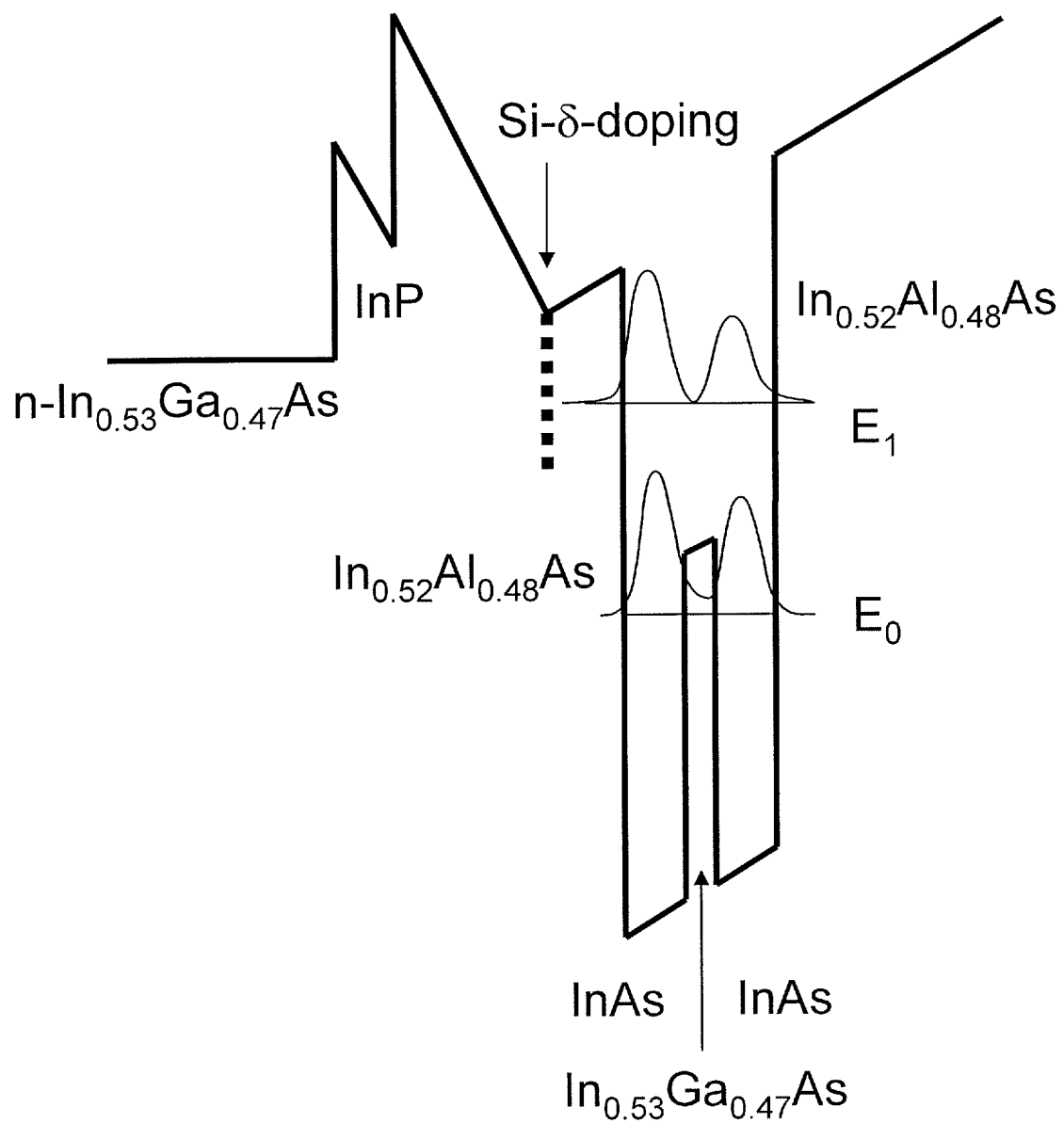
FIG. 10 is a schematic diagram illustrating the band structure of the conduction band in the semiconductor device (composite channel InAs-based HEMT) in accordance with the second modification to the first embodiment.

Further, although a dual quantum well layer where the lower barrier layer 12, the first well layer 13, the intermediate barrier layer 14, the second well layer 15, and the upper barrier layer 16 are sequentially stacked, i.e., the dual quantum well layer in a five-layer structure, is used as the electron transit layer 24 in the above-described embodiment and modification thereof, this is not limiting and any dual quantum well layers may be used which include two well layers quantum-mechanically combining with each other. For example, as depicted in FIG. 9, dual quantum well layers where an InAs layer (first well layer) 13, an $In_{0.53}Ga_{0.47}As$ layer (intermediate barrier layer) 14, and an InAs layer (second well layer) 15 are sequentially stacked, i.e., a dual quantum well layers in a three-layer structure which include the two well layers 13 and 15 quantum-mechanically combining with each other, may be used as the electron transit layer 24. This is referred to as an InAs/InGaAs/InAs composite channel HEMT, a triple layer composite channel HEMT, or an InAs/InGaAs/InAs triple layer composite channel HEMT. This is also referred to as a second modification. The band structure of a conduction band in the vertical direction of a HEMT including such a dual quantum well layer in a three-layer structure as the electron transit layer 24 is depicted in FIG. 10. Similar to the above embodiment, also in this modification, the probability that electrons exist in the InAs layers (well layers) 13 and 15 where the effective mass of the electrons (effective mass of the electrons in the $\Gamma$ valley) is reduced both at the ground level $E_0$ and the first excitation level $E_1$ is increased, which reduces the electrons existing in the InGaAs layer (barrier layer) 14 where the effective mass of the electrons (effective mass of the electrons in the $\Gamma$ valley) is increased thereby further increasing the device speed.

Further, the present disclosure has been described with reference to a HEMT structured to include an electron supply layer 25 over an electron transit layer 24 (single dope structure HEMT) in the above-described embodiment, this is not limiting.

Figure 11:
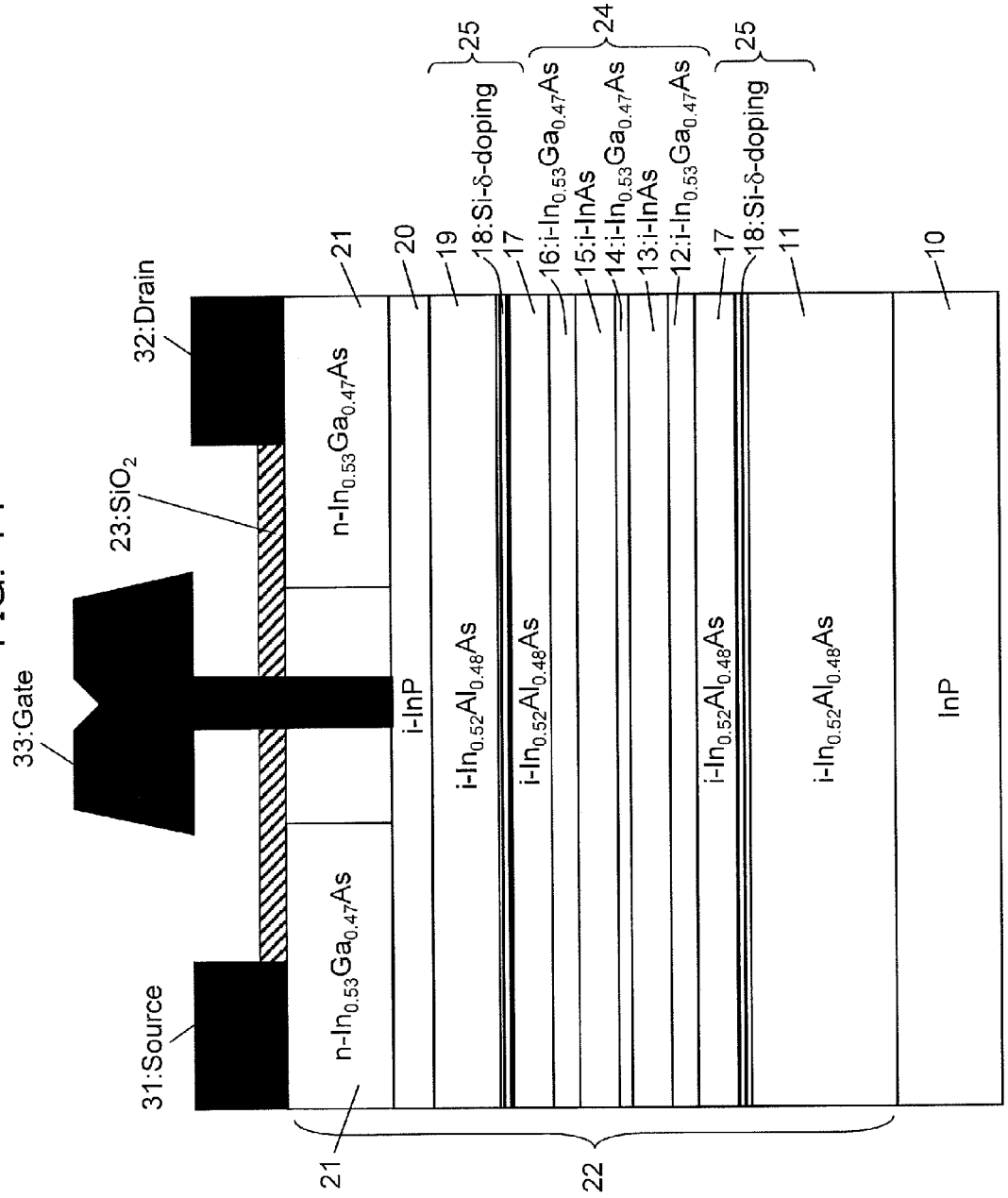
FIG. 11 is a schematic cross-sectional view illustrating the structure of a semiconductor device (composite channel InAs-based HEMT) in accordance with a third modification to the first embodiment.
Figure 12:
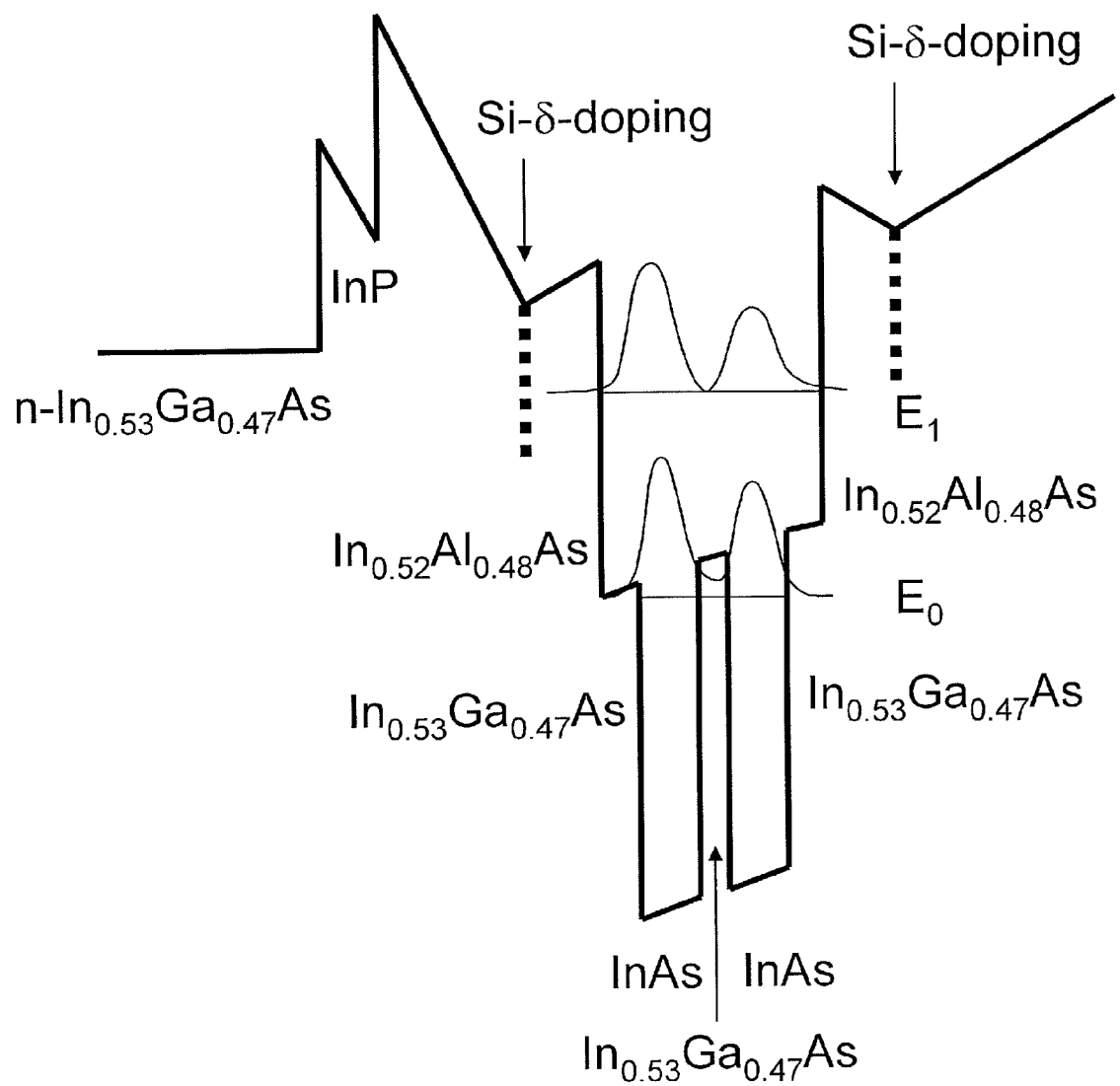
FIG. 12 is a schematic diagram illustrating the band structure of the conduction band in the semiconductor device (composite channel InAs-based HEMT) in accordance with the third modification to the first embodiment.

For example, as depicted in FIG. 11, the present disclosure is also applicable to a HEMT structured to include electron supply layers 25 over and under the electron transit layer 24 (double dope structure HEMT). More specifically, an Si-δ-doping layer 18 and an i-$In_{0.52}Al_{0.48}As$ spacer layer 17 defining the electron supply layer 25 may be provided between the i-$In_{0.52}Al_{0.48}As$ buffer layer 11 and the i-$In_{0.53}Ga_{0.47}As$ barrier layer 12 defining the electron transit layer 24 in the HEMT of the above-described embodiment. In this case, the i-$In_{0.52}Al_{0.48}As$ buffer layer 11 functions as a barrier layer defining the electron supply layer 25. This HEMT referred to as an InGaAs/InAs/InGaAs/InAs/InGaAs double dope composite channel HEMT. This is also referred to as a third modification. The band structure of a conduction band in the vertical direction in a HEMT having such a structure is depicted in FIG. 12. In such a double dope structure HEMT, the electron density in the electron transit layer 24 can be higher than that of a single dope structure HEMT.

Figure 13:
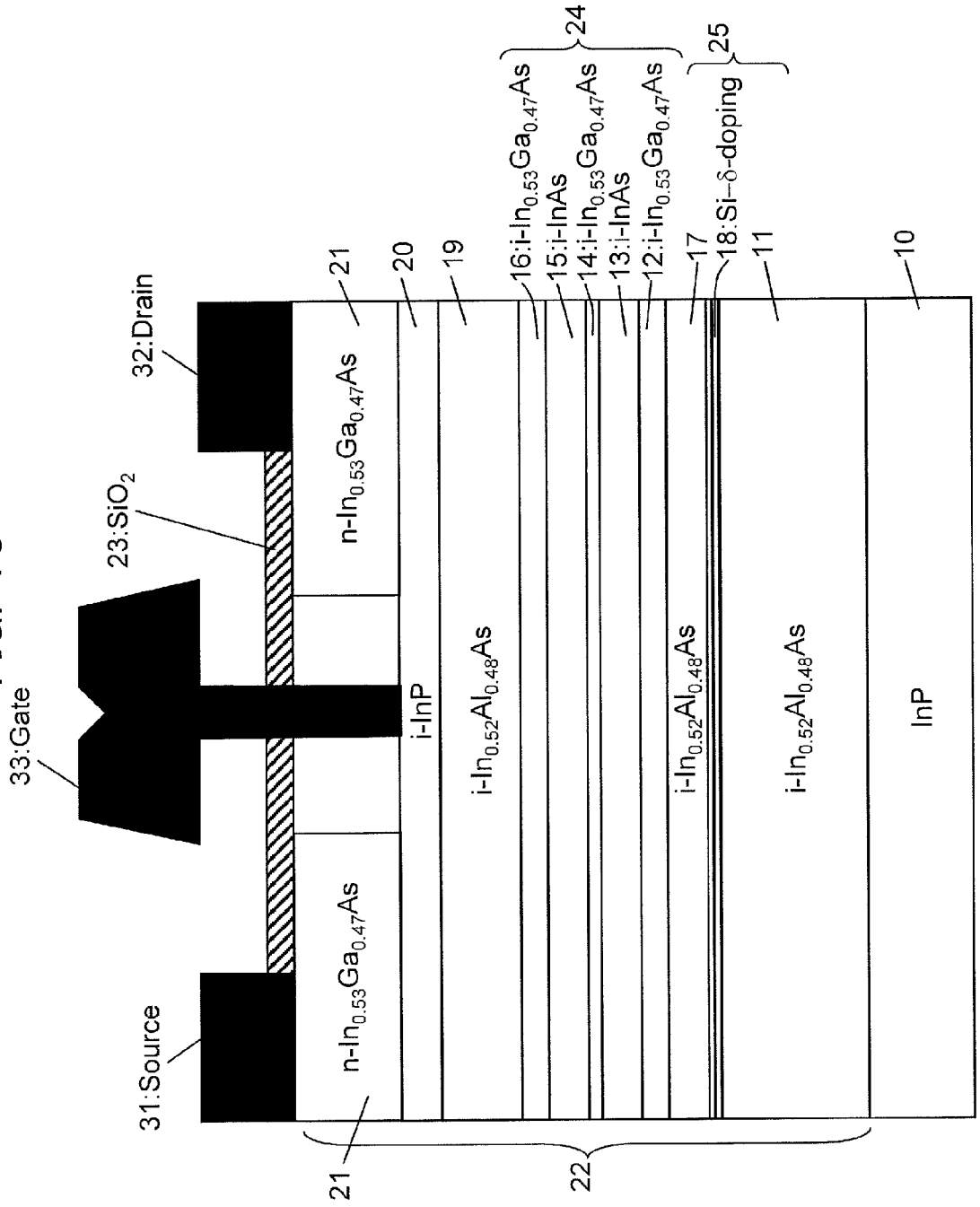
FIG. 13 is a schematic cross-sectional view illustrating the structure of a semiconductor device (composite channel InAs-based HEMT) in accordance with a fourth modification to the first embodiment.
Figure 14:
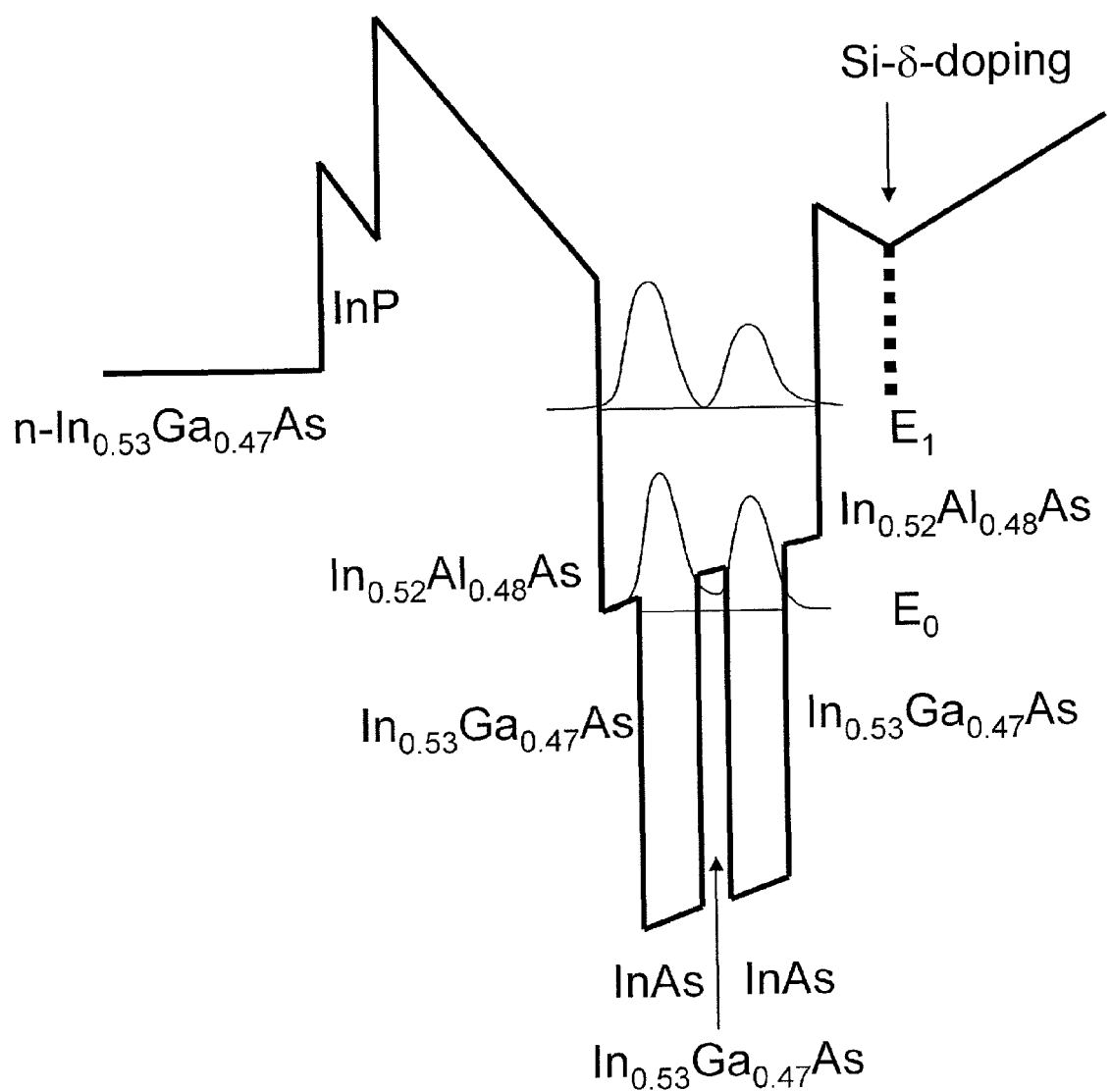
FIG. 14 is a schematic diagram illustrating the band structure of the conduction band in the semiconductor device (composite channel InAs-based HEMT) in accordance with the fourth modification to the first embodiment.

Alternatively, as depicted in FIG. 13, the present disclosure is also applicable to a HEMT structured to include an electron supply layer 25 under the electron transit layer 24 (reverse HEMT; single dope structure HEMT). More specifically, an Si-δ-doping layer 18 and an i-$In_{0.52}Al_{0.48}As$ spacer layer 17 defining the electron supply layer 25 may be provided between the i-$In_{0.52}Al_{0.48}As$ buffer layer 11 and the i-$In_{0.53}Ga_{0.47}As$ barrier layer 12 defining the electron transit layer 24, and an i-$In_{0.52}Al_{0.48}As$ barrier layer 19 may be provided over the i-$In_{0.53}Ga_{0.47}As$ barrier layer 16 defining the electron transit layer 24 without providing an i-$In_{0.52}Al_{0.48}As$ spacer layer 17 and an Si-δ-doping layer 18, in the HEMT of the above-described embodiment. In this case, the i-$In_{0.52}Al_{0.48}As$ buffer layer 11 functions as a barrier layer defining the electron supply layer 25. The i-$In_{0.52}Al_{0.48}As$ barrier layer 19 may be formed with a thickness of about 9 nm. This HEMT referred to as an InGaAs/InAs/InGaAs/InAs/InGaAs composite channel reverse HEMT. This is also referred to as a fourth modification. The band structure of a conduction band in the vertical direction in a HEMT having such a structure is depicted in FIG. 14.

Further, although the double dope structure HEMT and the reverse HEMT have been described as the modifications to the above-described embodiment, the structures (e.g., refer to FIGS. 7 to 10) of the modifications to the above-described embodiment the may be applicable the double dope structure HEMT and the reverse HEMT.

As described above, also in a double dope structure HEMT and a reverse HEMT, many electrons as possible exist in the well layer where the effective mass of electrons decreases even when the percentage of electron in the first excitation level $E_1$ is increased, thereby further increasing the device speed.

[Second Embodiment]

Next, a semiconductor device in accordance with a second embodiment will be described with reference to FIGS. 15-20B.

The semiconductor device in accordance with this embodiment is a GaAs-based HEMT, which is different from the above-described first embodiment and modifications thereof (refer to the drawings) which is an InP-based HEMT. In other words, in addition to a InP-based HEMT, the present disclosure can also be applicable to an GaAs-based HEMT.

Figure 15:
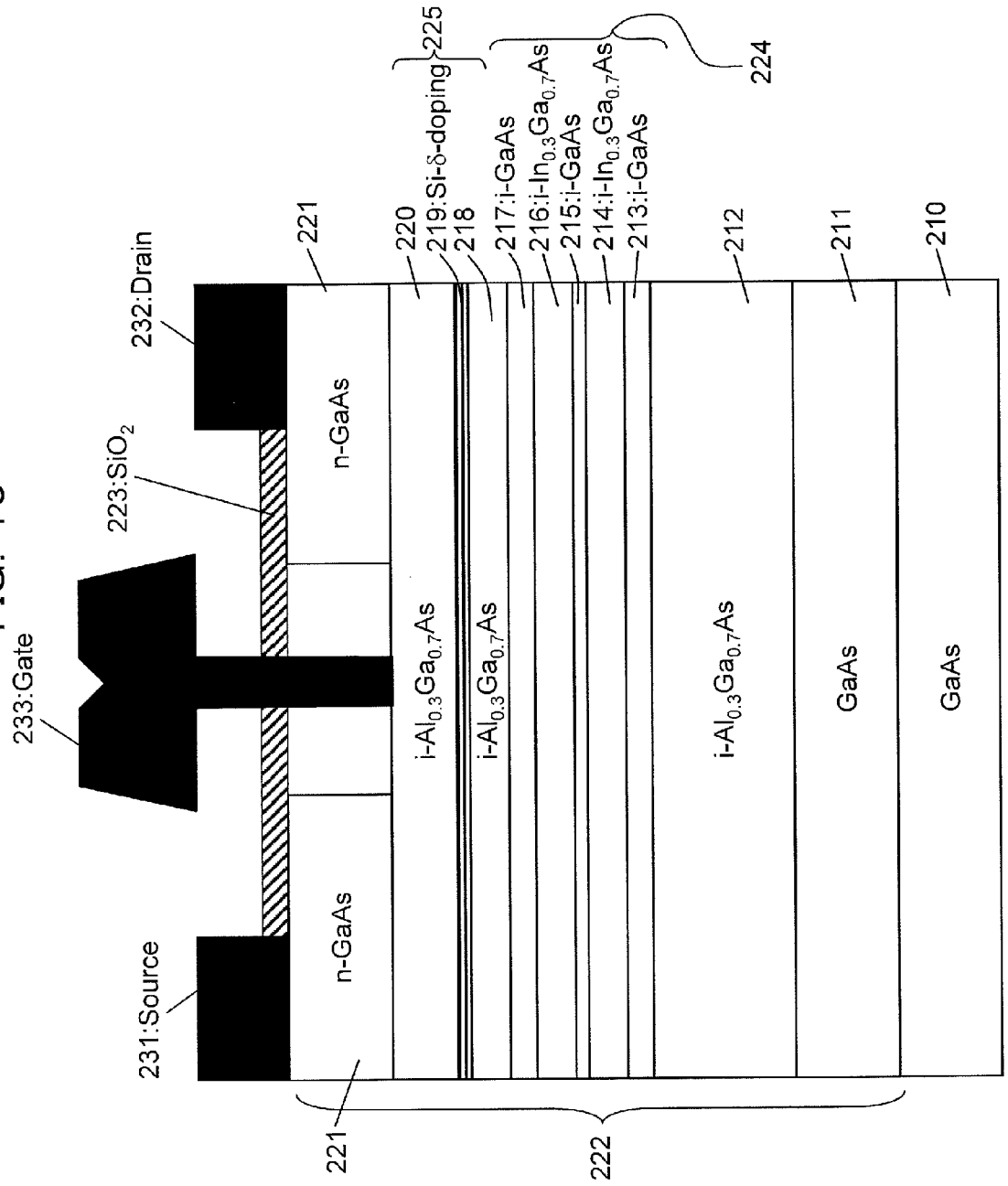
FIG. 15 is a schematic cross-sectional view illustrating the structure of a semiconductor device (composite channel GaAs-based HEMT) in accordance with a second embodiment.

As depicted in FIG. 15, this GaAs-HEMT includes, a substrate 210, a semiconductor stacked structure 222 provided over the substrate 210, and a gate electrode 233, a source electrode 231, and the drain electrode 232, provided over the semiconductor stacked structure 222.

In the present embodiment, the substrate 210 is a semi-insulating GaAs substrate (semiconductor substrate). For example, the substrate 210 is a semi-insulating (100) GaAs substrate.

The semiconductor stacked structure 222 is a semiconductor stacked structure including an electron transit layer 224 and an electron supply layer 225. Here, the semiconductor stacked structure 222 has a structure where a buffer layer 211, a barrier layer 212, an electron transit layer 224, an electron supply layer 225, and a cap layer 221 are sequentially stacked.

In this embodiment, buffer layer 211 is a GaAs layer, having a thickness of about 1 μm. Further, the barrier layer 212 is an AlGaAs layer. Here, the barrier layer 212 is an undoped AlGaAs layer. For example, the barrier layer 212 is an i-$Al_{0.3}Ga_{0.7}As$ layer, having a thickness of about 50 nm. As described above, since AlAs and GaAs have the substantially same lattice constant, in $Al_yGa_{1-y}As$ defining the barrier layer 212, y is about 0.3.

The electron transit layer 224 is a dual quantum well layer having a structure where a GaAs layer (lower barrier layer) 213, an InGaAs layer (first well layer) 214, a GaAs layer (intermediate barrier layer) 215, an InGaAs layer (second well layer) 216, and a GaAs layer (upper barrier layer) 217 are sequentially stacked. Here, the electron transit layer 224 is a dual quantum well layer having a structure where an undoped GaAs layer 213, an undoped InGaAs layer 214, an undoped GaAs layer 215, an undoped InGaAs layer 216, and an undoped GaAs layer 217 are sequentially stacked. For example, the electron transit layer 224 is a dual quantum well layer having a structure where an i-GaAs layer 213, an i-$In_{0.3}Ga_{0.7}As$ layer 214, an i-GaAs layer 215, an i-$In_{0.3}Ga_{0.7}As$ layer 216, and an i-GaAs layer 217 are sequentially stacked. Here, the i-GaAs layer 213, the i-$In_{0.3}Ga_{0.7}As$ layer 214, the i-GaAs layer 215, the i-$In_{0.3}Ga_{0.7}As$ layer 216, and the i-GaAs layer 217 have thicknesses of about 2 nm, about 3 nm, about 2 nm, about 3 nm, and about 2 nm, respectively. Thus, the total thickness of the dual quantum well layer as the electron transit layer 224 is about 12 nm.

Note that such a dual quantum well layer is referred to as a GaAs/InGaAs/GaAs/InGaAs/GaAs dual quantum well layer. Further, such an electron transit layer is referred to as a GaAs/InGaAs/GaAs/InGaAs/GaAs electron transit layer, or a GaAs/InGaAs/GaAs/InGaAs/GaAs composite channel. Further, such a HEMT including a GaAs/InGaAs/GaAs/InGaAs/GaAs electron transit layer is referred to as a GaAs/InGaAs/GaAs/InGaAs/GaAs composite channel HEMT, a five-layered composite channel HEMT, or a GaAs/InGaAs/GaAs/InGaAs/GaAs five-layered composite channel HEMT.

As described above, in a composite channel structure, the thickness of the InGaAs layer is reduced to increase the indium content (composition of InAs) so as to be higher than the composition x=about 0-0.15 of $In_xGa_{1-x}As$ defining the electron transit layer (when x=0, the GaAs electron transit layer) in a typical GaAs-based pseudo lattice-matched HEMT. For example, the indium content (composition of InAs) can be increased to x=0.3-0.4 in the composite channel structure in the above-described embodiment, and x=0.5-0.6 in the composite channel structure in the modification to the above-described embodiment.

The electron supply layer 225 has a structure where an AlGaAs spacer layer 218, an Si-δ-doping layer 219, and an AlGaAs barrier layer 220 are sequentially stacked. Here, the electron supply layer 225 has a structure where an undoped AlGaAs spacer layer 218, an Si-δ-doping layer 219 formed from AlGaAs provided with an n-type conductivity by δ-doping Si, and an undoped AlGaAs barrier layer 220 are sequentially stacked. For example, the electron supply layer 225 has a structure where an i-$Al_{0.3}Ga_{0.7}As$ spacer layer 218 having a thickness of about 3 nm, an Si-δ-doping layer 219 having an Si-δ-doping level of about $5 \times 10^{12}$ cm$^{-2}$, and an i-$Al_{0.3}Ga_{0.7}As$ barrier layer 220 having a thickness of about 6 nm, are sequentially stacked. As described above, since AlAs and GaAs have the substantially same lattice constant, in $Al_yGa_{1-y}As$ defining the electron supply layer 225 functioning as a barrier layer 225, y is about 0.3.

Note that such an electron supply layer 225 is referred to as an AlGaAs/Si-δ-doping/AlGaAs electron supply layer. The electron supply layer 225 may also be an AlGaAs layer (n-type AlGaAs layer) provided with an n-type conductivity by doping Si.

The cap layer 221 is a GaAs layer. Here, the cap layer 221 is an n-GaAs cap layer provided with an n-type conductivity by doping Si, and having a thickness of about 20 nm, and an Si-doping level ($N_D$) of about $5 \times 10^{18}$ cm$^{-3}$. Note that cap layer 221 may have a dual-layer structure. In such a case, the upper layer of the n-GaAs layer is an n-InGaAs layer including a smaller amount of In.

The semiconductor stacked structure 222 may be any structure including an electron transit layer 224 and an electron supply layer 225, and may have a different stacked structure. The semiconductor stacked structure 222 is referred to as a hetero structure semiconductor layer. In this embodiment, the barrier layer 212 provided over the substrate 210, and contacting the bottom of the electron transit layer 224 is also referred to as a first semiconductor layer. The spacer layer 218 (electron supply layer 225) contacting the top of the electron transit layer 224 is also referred to as second semiconductor layer. The barrier layer 212 and the spacer layer 218 are also referred to as barrier layers over and under the electron transit layer 224. The dual quantum well layer as the electron transit layer 224 is also referred to as a dual quantum well layer having a structure where a first well layer, an intermediate barrier layer, and the second well layer 15 are sequentially stacked.

A gate electrode 233, a source electrode 231, and a drain electrode 232 are provided over the semiconductor stacked structure 222 structured as set forth above, the surface of which is covered with an $SiO_2$ film (insulation film) 223.

In this embodiment, the source electrode 231 and the drain electrode 232, made from AuGe/Ni/Au, for example, are provided over the n-GaAs cap layer 221. Further, the gate electrode 233 is provided over the i-AlGaAs barrier layer 220, made from Ti/Pt/Au, for example.

In this embodiment, considering the profile (electron distributions) of the wave function in each of the quantum levels generated in the electron transit layer 224 due to two-dimensional confinement of electrons, the electron transit layer 224 is formed as a dual quantum well layer including two well layers, as set forth above. In other words, this embodiment employs a dual quantum well layer in a five-layer structure of GaAs/InGaAs/GaAs/InGaAs/GaAs, as a composite channel.

Figure 16:
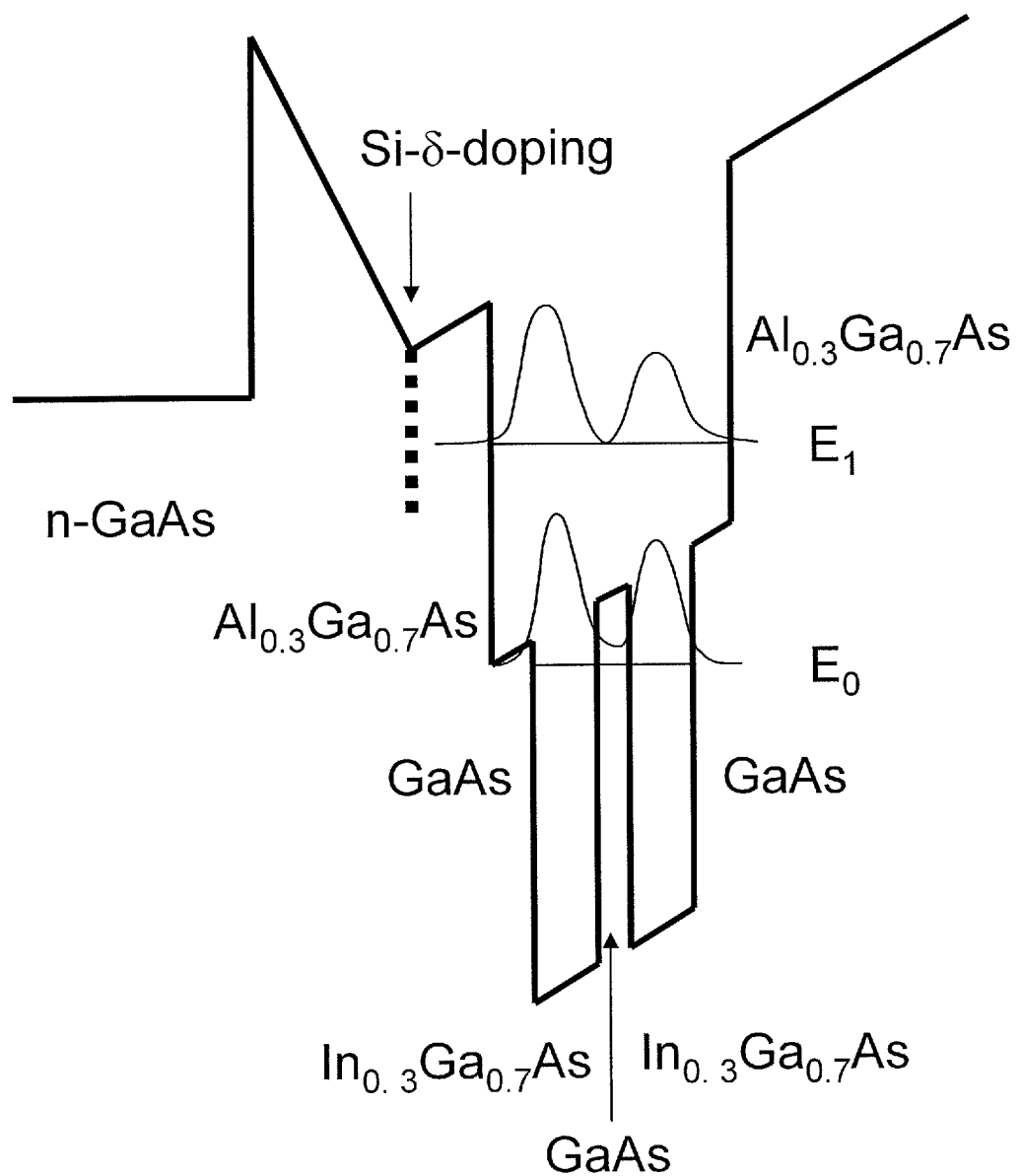
FIG. 16 is a schematic diagram illustrating the band structure of the conduction band in the semiconductor device (composite channel GaAs-based HEMT) in accordance with the second embodiment.

Here, FIG. 16 is a schematic diagram illustrating the band structure of the conduction band in the vertical direction of the GaAs/InGaAs/GaAs/InGaAs/GaAs composite channel HEMT.

Since this embodiment is structured as set forth above, the energy of the conduction band of the barrier layers (GaAs layers) 213, 215, and 217 defining the electron transit layer 224 is lower than the energy of the conduction band of the AlGaAs barrier layer (first semiconductor layer) 212 and the AlGaAs spacer layer (second semiconductor layer) 218 contacting the top and bottom of the electron transit layer 224, as depicted in FIG. 16, defining a quantum well structure. Further, the energy of the conduction band of the well layers (InGaAs layers) 214 and 216 defining the electron transit layer 224 is lower than the energy of the conduction band of the barrier layers (GaAs layers) 213, 215, and 217 contacting the tops and bottoms of the well layers 214 and 216, defining a quantum well structure. In this manner, in the quantum well structure formed from the barrier layers 213, 215, and 217 defining the electron transit layer 224 and the AlGaAs barrier layer 212 and the AlGaAs spacer layer 218, the quantum well structure formed from the well layers 214 and 216 and the barrier layers 213, 215, and 217 defining the electron transit layer 224 is provided (here, dual quantum well structure). Note that such an electron transit layer 224 is referred to as a double well composite channel layer.

Further, in this embodiment, as set forth above, the total thickness of the electron transit layer 224 is about 12 nm, two or three quantum levels is formed in the electron transit layer 224 due to the two-dimensional confinement of electrons. Additionally, since the GaAs layer as the intermediate barrier layer 215 has a smaller thickness of about 2 nm or smaller, for example, the two InGaAs layers as the well layers 214 and 216 quantum-mechanically combine with each other.

As a result, as depicted in FIG. 16, the ground level $E_0$ is generated in the InGaAs layers, as the two well layers 214 and 216 defining the electron transit layer 224, while the first excitation level $E_1$ is generated in the dual quantum well layer as the electron transit layer 224. In other words, the ground level $E_0$ is generated in the two InGaAs layers 214 and 216 that quantum-mechanically combined with each other, while the first excitation level $E_1$ is generated across the entire GaAs/InGaAs/GaAs/InGaAs/GaAs dual quantum well layer 224.

FIG. 16 also illustrates the electron distribution (|wave function|$^2$) in each of the ground level $E_0$ and the first excitation level $E_1$.

As depicted in FIG. 16, electrons in the ground level $E_0$ dominantly exist in the InGaAs layers 214 and 216 and have two peaks since the existence probability of electrons in the part of the GaAs layer 215 is reduced, due to the GaAs layer 215 having a higher potential located at the center therebetween. Unlike the wave function of the first excitation level $E_1$, however, the wave function of the ground level $E_0$ does not have a node near the center. In other words, since electrons do not exist having two peaks with a node near the center, the first excitation level $E_1$ is not generated in the InGaAs layers as the two well layers 214 and 216. Additionally, since the two peaks are continuous, not being separated from each other, the two InGaAs layers 214 and 216 quantum-mechanically combine with each other. In such a case, because of the layer structure of the dual quantum well layer 224, electrons in the ground level $E_0$ exist, having a single peak in each of the two InGaAs layers 214 and 216, and the existence probability is increased in the two InGaAs layers 214 and 216.

In contrast, electrons in the first excitation level $E_1$ exist having two peaks with a node near the center across the entire GaAs/InGaAs/GaAs/InGaAs/GaAs dual quantum well layer 224. In other words, since electrons exist having two peaks with a node near the center, the first excitation level $E_1$ is generated in the GaAs/InGaAs/GaAs/InGaAs/GaAs dual quantum well layer 224. In such a case, because of the layer structure of the dual quantum well layer 224, electrons in the first excitation level $E_1$ exist, having a single peak in each of the two InGaAs layers 214 and 216, and the existence probability is increased in the two InGaAs layers 214 and 216.

If the two InGaAs layers 214 and 216 do not quantum-mechanically combine with each other, the respective quantum levels are generated in the InGaAs layers 214 and 216, which are the ground level $E_0$ and the first excitation level $E_1$. Hence, the quantum level in the dual quantum well layer 224 is the second excitation level $E_2$ which has three peaks, and the existence probability of electrons in the two InGaAs layers 214 and 216 cannot be increased.

Accordingly, the probability that electrons exist in the InGaAs layers (well layers) 214 and 216 where the effective mass of the electrons (effective mass of the electrons in the $\lceil$ valley) is reduced both at the ground level $E_0$ and the first excitation level $E_1$ is increased, which reduces the electrons existing in the GaAs layers (barrier layers) 213, 215, and 217 where the effective mass of the electrons (effective mass of the electrons in the $\lceil$ valley) is increased thereby further increasing the device speed. A quantum mechanical calculation reveals that about 80% or more electrons (e.g., about 85% of electrons) can place in the InGaAs layers 214 and 216 even in the first excitation level $E_1$ in a HEMT structured as set forth above, thereby further increasing the device speed Next, a method of manufacturing a semiconductor device in accordance with this embodiment (GaAs-based HEMT), specifically, a method of manufacturing a GaAs/In$_{0.3}$Ga$_{0.7}$As/GaAs/In$_{0.3}$Ga$_{0.7}$As/GaAs composite channel HEMT will be described with reference to FIGS. 17A to 20B.

Figure 17A:
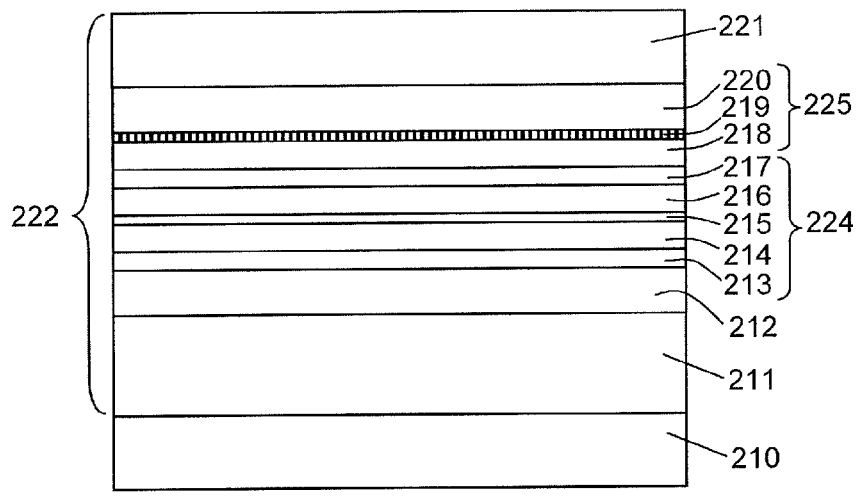
FIGS. 17A to 17C are schematic cross-sectional views illustrating a method of manufacturing the semiconductor device (composite channel GaAs-based HEMT) in accordance with the second embodiment.

First, as depicted in FIG. 17A, a GaAs buffer layer 211; an i-Al$_{0.3}$Ga$_{0.7}$As barrier layer 212; an i-GaAs barrier layer 213, an i-In$_{0.3}$Ga$_{0.7}$As well layer 214, an i-GaAs barrier layer 215, an i-In$_{0.3}$Ga$_{0.7}$As well layer 216, and an i-GaAs barrier layer 217 defining an electron transit layer 224; an i-Al$_{0.3}$Ga$_{0.7}$As spacer layer 218, an Si-δ-doping layer 219, and an i-Al$_{0.3}$Ga$_{0.1}$As barrier layer 220 defining an electron supply layer 225; and an n-GaAs cap layer 221 are sequentially stacked over a semi-insulating GaAs substrate 210, with MBE or metal organic chemical vapor deposition (MOCVD), for example, to form a semiconductor stacked structure 222.

Here, the GaAs buffer layer 211 is formed with a thickness of about 1 μm. The i-Al$_{0.3}$Ga$_{0.7}$As barrier layer 212 is formed with a thickness of about 50 nm. The i-GaAs barrier layer 213, the i-GaAs barrier layer 215, and the i-GaAs barrier layer 217 are formed with a thickness of about 2 nm. The i-In$_{0.3}$Ga$_{0.7}$As well layer 214 and the i-In$_{0.3}$Ga$_{0.7}$As well layer 216 are formed with a thickness of about 3 nm. The i-Al$_{0.3}$Ga$_{0.7}$As spacer layer 218 is formed with a thickness of about 3 nm. The Si-δ-doping layer 219 is δ-doped with an Si-δ-doping level of about $5\times10^{12}$ cm$^{-2}$. The i-Al$_{0.3}$Ga$_{0.7}$As barrier layer 220 is formed with a thickness of about 6 nm. The n-GaN cap layer 221 has a thickness of about 20 nm, and an Si doping level (Si doping concentration) of about $5\times10^{18}$ cm$^{-3}$.

Figure 17B:
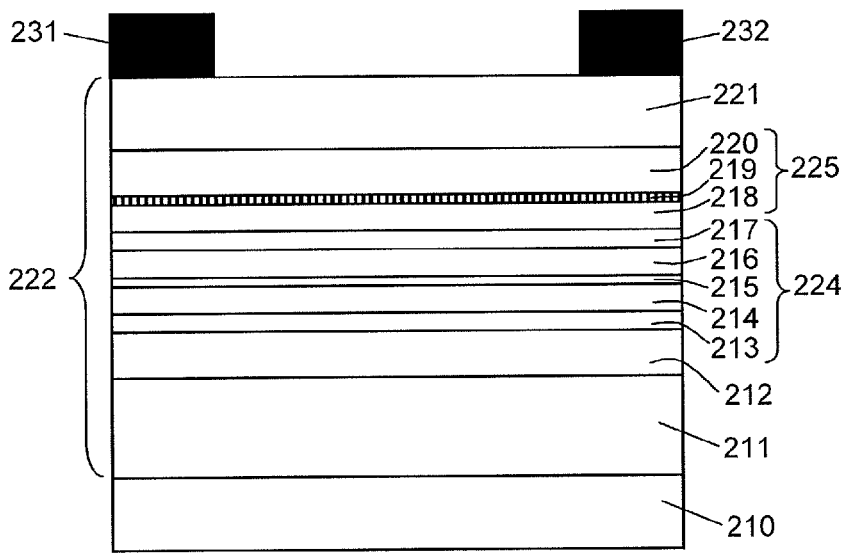

Next, after element isolation, as depicted in FIG. 17B, AuGe, Ni, and Au are stacked, for example, followed by annealing, to form a source electrode 231 and a drain electrode 232 with an AuGe/Ni/Au three-layer structure, for example. Thereby, the source electrode 231 and the drain electrode 232 are formed over the n-GaAs cap layer 221.

Figure 17C:
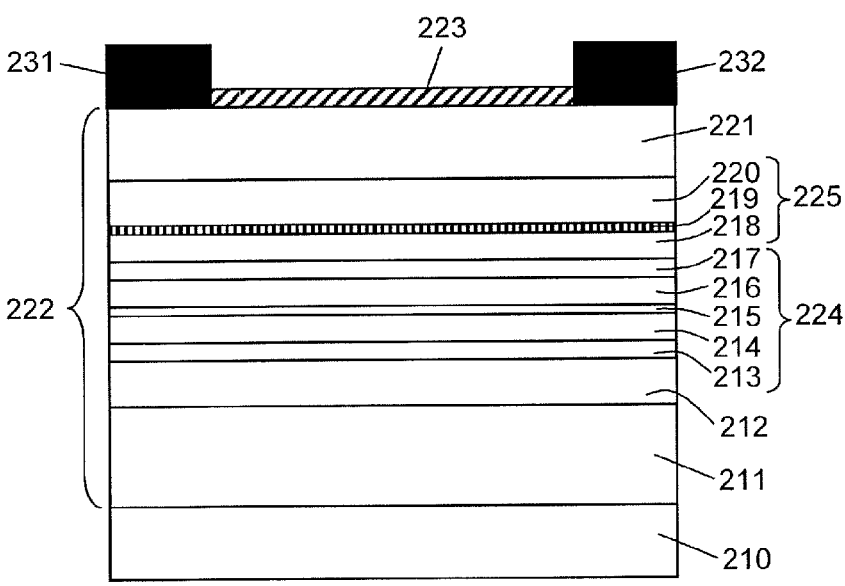

Next, as depicted in FIG. 17C, an SiO$_2$ film 223 is formed with plasma-enhanced CVD, for example, over the n-GaN cap layer 221 between the source electrode 231 and the drain electrode 232. Here, the SiO$_2$ film 223 is formed with a thickness of about 20 nm.

Next, as depicted in FIGS. 18A to 20B, a T-type gate electrode 233 is formed.

Figure 18A:
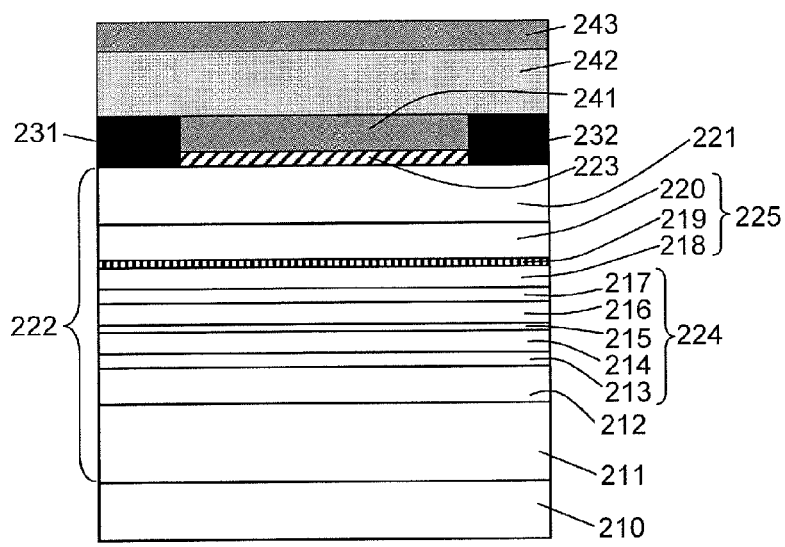
FIGS. 18A to 18C are schematic cross-sectional views illustrating the method of manufacturing the semiconductor device (composite channel GaAs-based HEMT) in accordance with the second embodiment.

More specifically, firstly, as depicted in FIG. 18A, three-layer resist films 241-243 are formed. Here, a ZEP resist, a PMGI resist, and the ZEP resist are sequentially applied, to form three-layer resist films wherein a ZEP resist film 241, a PMGI resist film 242, and a ZEP resist film 243 are sequentially stacked.

Figure 18B:
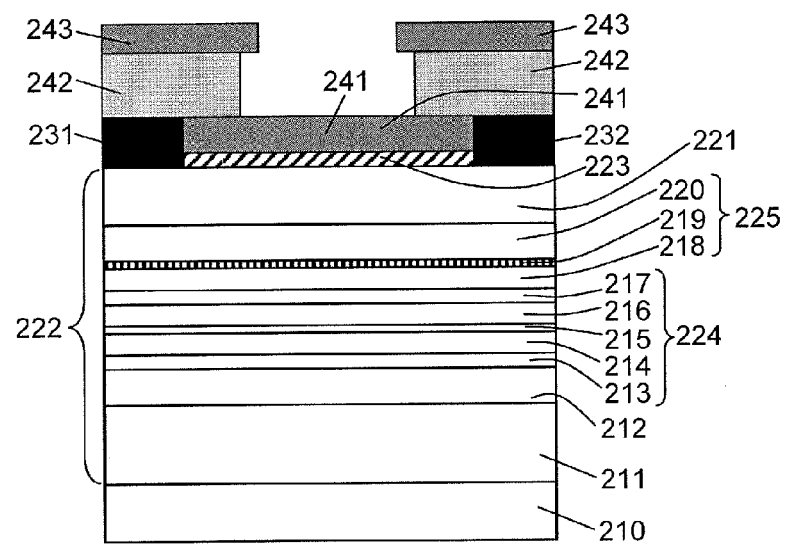
Figure 18C:
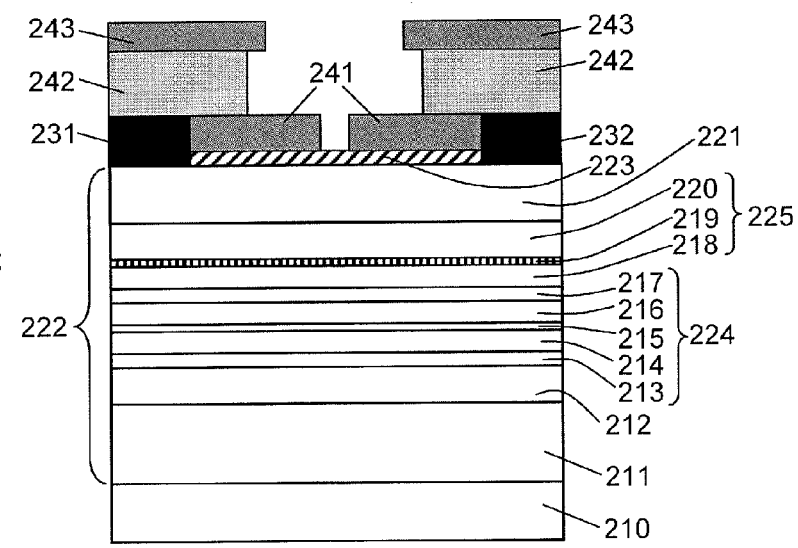

Next, as depicted in FIG. 18B, the region defining a head portion of the T-type gate electrode 233 is exposed with electron beam exposure, for example, to define an opening in the ZEP resist film 243 and the PMGI resist film 242. As depicted in FIG. 18C, the region defining a foot portion of the T-type gate electrode 233 is exposed with electron beam exposure, for example, to define an opening in the bottommost ZEP resist film 241, which is sized correspondingly to a desired gate length.

Figure 19A:
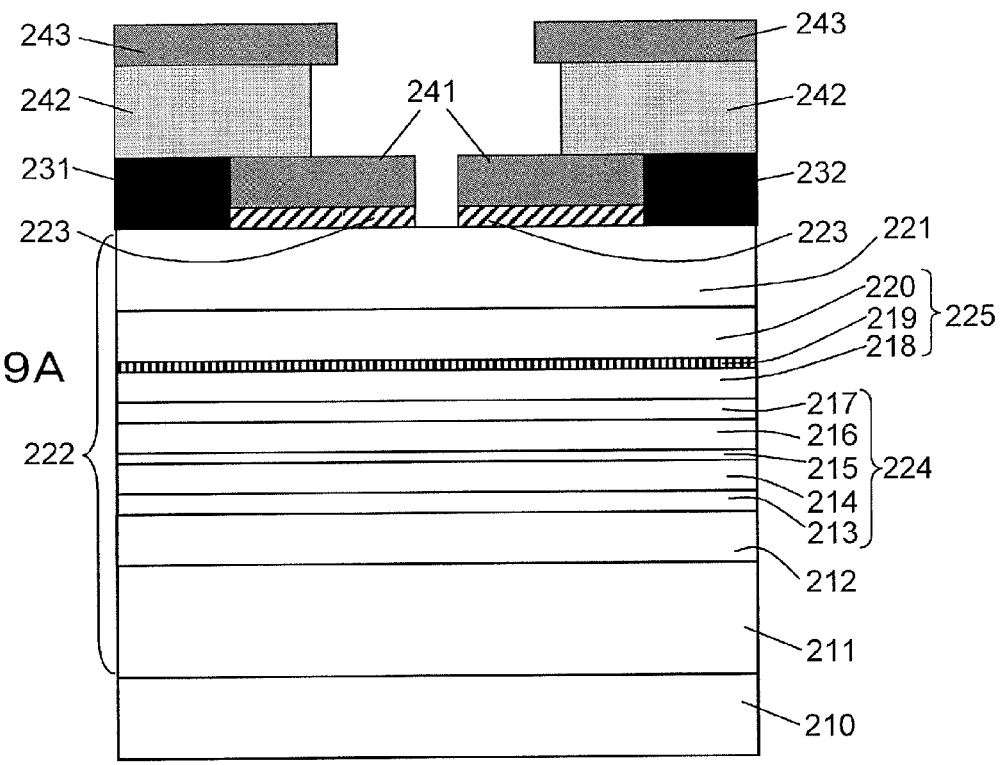
FIGS. 19A and 19B are schematic cross-sectional views illustrating the method of manufacturing the semiconductor device (composite channel GaAs-based HEMT) in accordance with the second embodiment.

Next, using the bottommost ZEP resist film 241 having the opening sized correspondingly to the desired gate length formed therein, as a mask, an opening is defined in the $SiO_2$ film 223 with reactive ion etching using $CF_4$ as an etching gas, for example, as depicted in FIG. 19A.

Figure 19B:
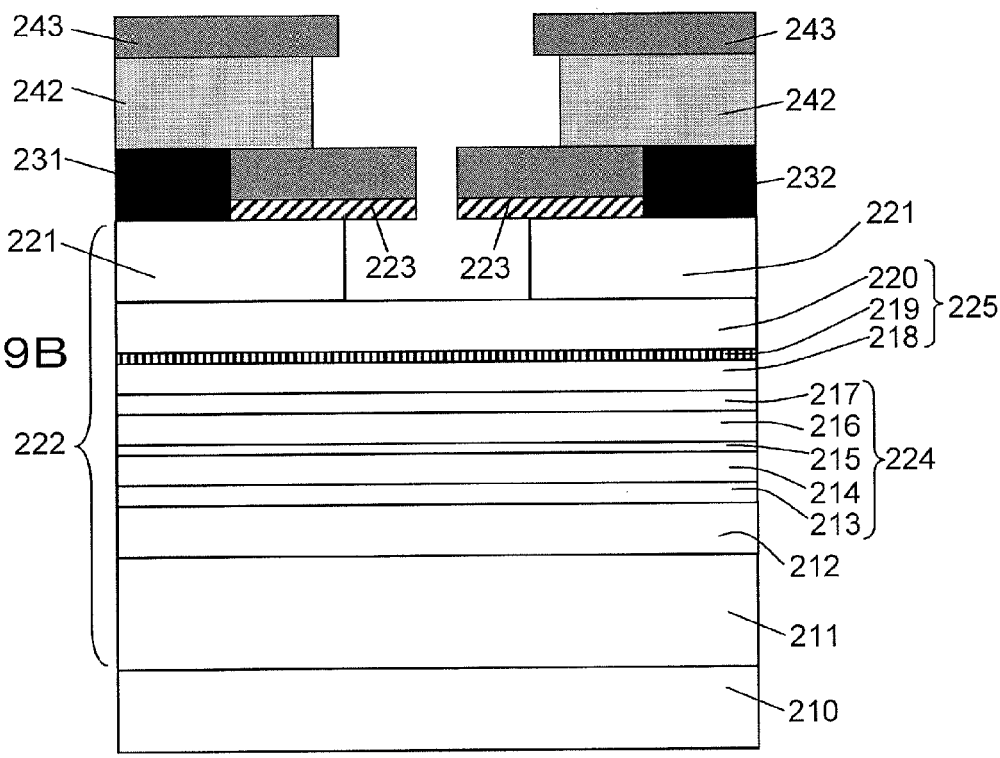

In order to electrically isolate the n-type GaAs cap layer 21, a recess is then formed in an wet etching using a solution mixture of ammonia water ($NH_4OH$) and hydrogen peroxide solution ($H_2O_2$) as an etching solution, for example, as depicted in FIG. 19B.

Figure 20A:
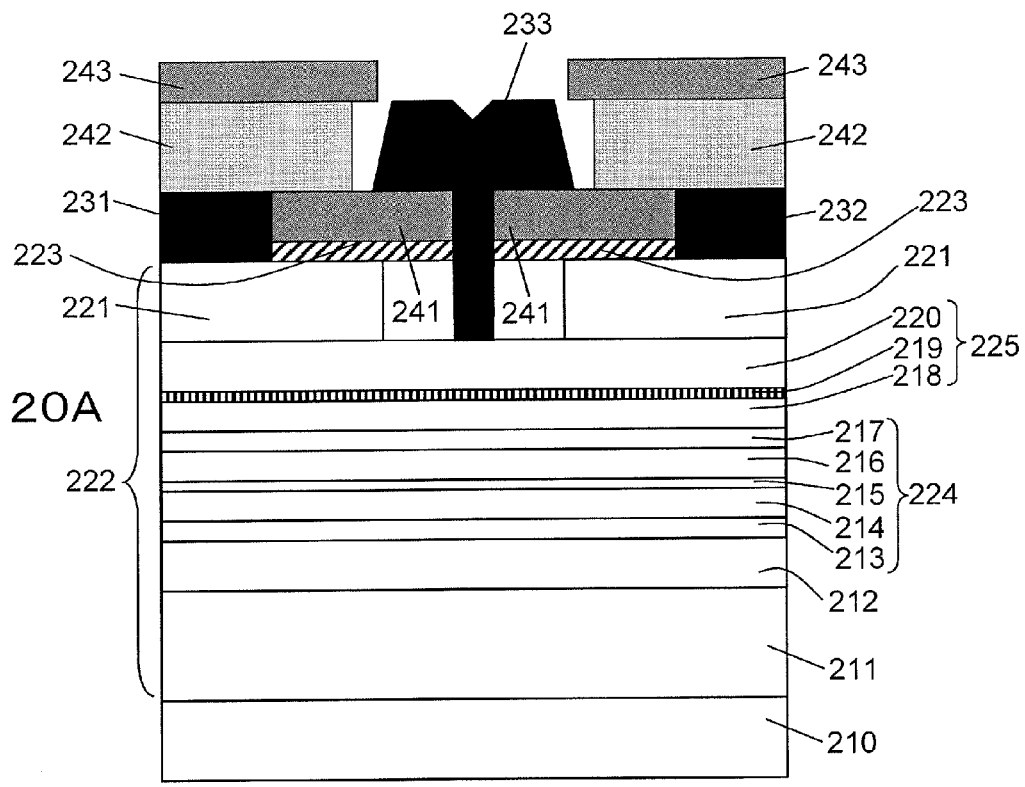
FIGS. 20A and 20B are schematic cross-sectional views illustrating the method of manufacturing the semiconductor device (composite channel GaAs-based HEMT) in accordance with the second embodiment.
Figure 20B:
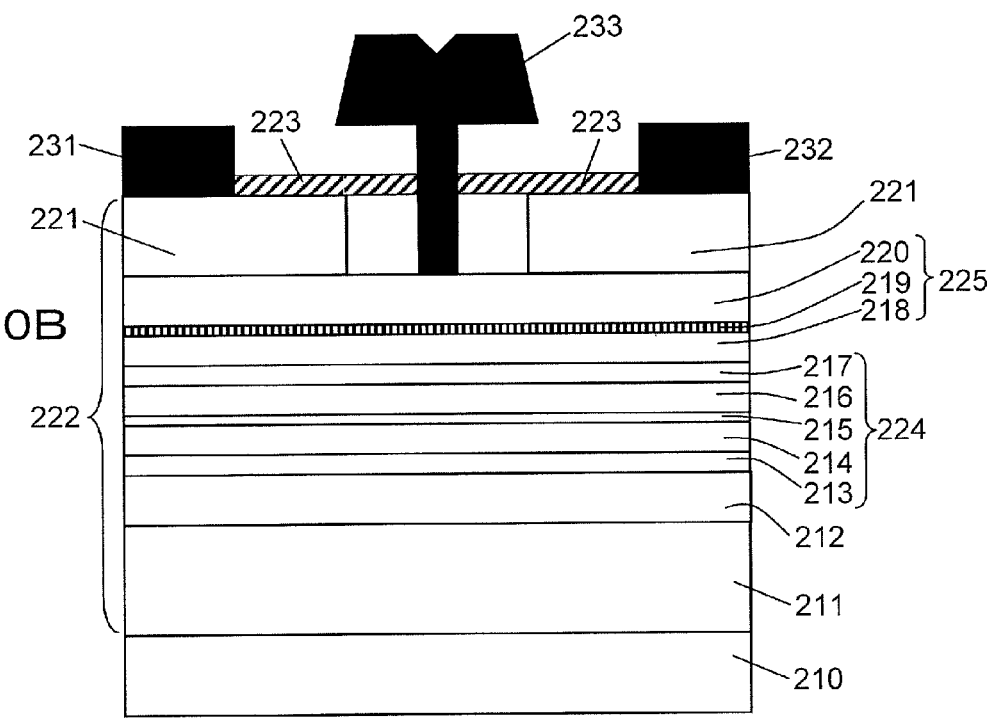

Finally, as depicted in FIGS. 20A and 20B, after evaporating Ti, Pt, and Au, for example, a T-type gate electrode 233 of a Ti/Pt/Au three-layer structure is formed by lift-off, for example. Thereby, a T-type gate electrode 233 is formed over the i-$Al_{0.3}Ga_{0.7}As$ barrier layer 220.

As described above, since the GaAs/InGaAs/GaAs/InGaAs/GaAs composite channel HEMT in this embodiment has the same structure as those of typical GaAs-based HEMTs except for the channel, it can be fabricated in the same processes as well-established processes for manufacturing GaAs-based HEMTs. In other words, ultra high-speed HEMTs which are well advanced to typical GaAs-based HEMTs can be achieved in the same processes as those for typical GaAs-based HEMTs.

Accordingly, as in the first embodiment described above, the semiconductor device in accordance with this embodiment is advantageous in that many electrons as possible exist in the well layer where the effective mass of electrons decreases even when the percentage of electron in the first excitation level $E_1$ is increased, thereby further increasing the device speed.

Note that the structure and the method of manufacturing the GaAs-based HEMT are not limited to those in the above-described embodiment. Any GaAs-based HEMTs may be possible, which include a first semiconductor layer provided over a substrate; an electron transit layer contacting a top of the first semiconductor layer; and a second semiconductor layer contacting a top of the electron transit layer, wherein the electron transit layer has a dual quantum well layer having a structure where a first well layer, an intermediate barrier layer, and a second well layer are sequentially stacked, an energy of a conduction band of the intermediate barrier layer is lower than an energy of conduction band of the first semiconductor layer and the second semiconductor layer, and a ground level is generated in the first and second well layers, and a first excitation level is generated in the dual quantum well layer. In other words, any GaAs-based HEMTs may be used, which includes a dual quantum well layer having two well layers quantum-mechanically combining with each other, and first and second semiconductor layers contacting the top and bottom of the dual quantum well layer and having a higher energy of the conduction band than that of the intermediate barrier layer in the dual quantum well layer.

For example, although the GaAs/InGaAs/GaAs/InGaAs/GaAs dual quantum well layer 224 is used for the composite channel and the compositions in the well layers 214 and 216 are adjusted in the above-described embodiment, the material and compositions are not limited to those in the above-described embodiment as long as a dual quantum well structure are provided which have the two well layers 214 and 216 the quantum-mechanically combining with each other. More specifically, for forming a dual quantum well layer by sequentially stacking a lower barrier layer, a first well layer, an intermediate barrier layer, a second well layer, and an upper barrier layer, the materials and the compositions of the barrier layers and the well layers may be determined such that the energy of the conduction band of the materials forming the first and second well layer becomes lower than the energy of the conduction band of the materials forming the lower barrier layer, the intermediate barrier layer, and the upper barrier layer, and the thickness of the intermediate barrier layer may be determined such that the two well layers quantum-mechanically combine with each other. For example, InGaAs may be used for all of the lower barrier layer, the first well layer, the intermediate barrier layer, the second well layer, and the upper barrier layer, and the compositions of InGaAs forming the barrier layers and the well layers may be adjusted such that the energy of the conduction band of InGaAs forming the first and second well layers becomes lower than the energy of the conduction band of InGaAs forming the lower barrier layer, the intermediate barrier layer, and the upper barrier layer. More specifically, when sequentially stacking an $In_{x1}Ga_{1-x1}As$ layer, an $In_{x2}Ga_{1-x2}As$ layer, an $In_{x3}Ga_{1-x3}As$ layer, an $In_{x4}Ga_{1-x4}As$ layer, and an $In_{x5}Ga_{1-x5}As$ layer, a dual quantum well structure is established if x2>max (x1, x3) and x4>max (x3, x5) stand, where max (xm, xn) gives the higher one of the compositions xm and xn. For example, the sequential stack of an i-$In_{0.15}Ga_{0.05}As$ layer (lower barrier layer) 213, an i-$In_{0.0}Ga_{0.5}As$ layer (first well layer) 214, an i-$In_{0.15}Ga_{0.85}As$ layer (intermediate barrier layer) 215, an i-$In_{0.5}Ga_{0.5}As$ layer (second well layer) 216, and an i-$In_{0.15}Ga_{0.05}As$ layer (upper barrier layer) 217 satisfies the above condition, and a dual quantum well structure is established. This HEMT is referred to as an InGaAs/$In_{0.5}Ga_{0.0}As$/InGaAs/$In_{0.5}Ga_{0.5}As$/InGaAs composite channel HEMT. Similar to the above-described embodiment, also in this case, the probability that electrons exist in the $In_{0.5}Ga_{0.5}As$ layers (well layers) 214 and 216 where the effective mass of the electrons (effective mass of the electrons in the ⌈ valley) is reduced both at the ground level $E_0$ and the first excitation level $E_1$ is increased, which reduces the electrons existing in the $In_{0.15}Ga_{0.85}As$ layers (barrier layers) 213, 215, and 217 where the effective mass of the electrons (effective mass of the electrons in the ⌈ valley) is increased thereby further increasing the device speed.

As described above, the first well layer 214 and the second well layer 216 may have a higher In content (composition of InAs) than that in the intermediate barrier layer 215. For example, the first well layer 214 and the second well layer 216 may be InGaAs layers having a higher In content than InGaAs forming the intermediate barrier layer 215.

Further, although the first well layer 214 and the second well layer 216 are semiconductor layers of the same material and composition in the above-described embodiment and modifications thereof, this is not limiting and the first well layer 214 and the second well layer 216 may be semiconductor layers of different materials and compositions. Further, although the first well layer 214 and the second well layer 216 are InGaAs layers of the same composition in the above-described embodiment and modification thereof, this is not limiting and the first well layer 214 and the second well layer 216 may be InGaAs layers of different compositions.

Further, although the lower barrier layer 213, the intermediate barrier layer 215, and the upper barrier layer 217 are semiconductor layers of the same material and composition in the above-described embodiment and modification thereof, the lower barrier layer 213, the intermediate barrier layer 215, and the upper barrier layer 217 may be semiconductor layers of different materials. Alternatively, the lower barrier layer 213, the intermediate barrier layer 215, and the upper barrier layer 217 may be semiconductor layers of the same material but different compositions. For example, the lower barrier layer 213, the intermediate barrier layer 215, and the upper barrier layer 217 may be InGaAs layers of different compositions. As described above, the lower barrier layer 213, the intermediate barrier layer 215, and the upper barrier layer 217 may be semiconductor layers of different materials and compositions.

Further, for example, a GaAs-based HEMT of the above-described this embodiment and the modification can be modified in the similar manner to the second to fourth modifications to the above-described first embodiment (e.g., refer to FIGS. 9 to 14). More specifically, the structures of the InP-based HEMTs as described in the second to fourth modifications to the above-described first embodiment is applicable to the GaAs-based HEMT of this embodiment and modification thereof.

[Miscellaneous]

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A semiconductor device, comprising:
   a first semiconductor layer provided over a substrate; an electron transit layer contacting a top of the first semiconductor layer; and
   a second semiconductor layer contacting a top of the electron transit layer,
   wherein the electron transit layer has a dual quantum well layer comprising a structure where a first well layer, an intermediate barrier layer, and a second well layer are sequentially stacked,
   wherein an energy of a conduction band of the intermediate barrier layer is lower than an energy of conduction band of the first semiconductor layer and the second semiconductor layer,
   wherein a ground level is generated in the first and second well layers, and a first excitation level is generated in the dual quantum well layer, and
   wherein electrons in the ground level exist having a single peak in each of the first well layer and the second well layer and electrons in the first excitation level exist having a single peak in each of the first well layer and the second well layer.

2. The semiconductor device according to claim 1, wherein the first well layer and the second well layer include a semiconductor of a same material and composition.

3. The semiconductor device according to claim 1, wherein the first well layer and the second well layer include semiconductors of different materials and compositions.

4. The semiconductor device according to claim 1, wherein the dual quantum well layer has a structure where a lower barrier layer, the first well layer, the intermediate barrier layer, the second well layer, and an upper barrier layer are sequentially stacked.

5. The semiconductor device according to claim 4, wherein the lower barrier layer, the intermediate barrier layer, and the upper barrier layer include a semiconductor of a same material and composition.

6. The semiconductor device according to claim 4, wherein the lower barrier layer, the intermediate barrier layer, and the upper barrier layer include semiconductors of different materials and compositions.

7. The semiconductor device according to claim 1, wherein the first well layer and the second well layer have a higher indium (In) content than the intermediate barrier layer.

8. The semiconductor device according to claim 1, wherein:
   the first semiconductor layer and the second semiconductor layer include InAlAs,
   the intermediate barrier layer includes InGaAs, and
   the first well layer and the second well layer include InAs.

9. The semiconductor device according to claim 1, wherein:
   the first semiconductor layer and the second semiconductor layer include InAlAs,
   the intermediate barrier layer includes InGaAs, and
   the first well layer and the second well layer include InGaAs that has a higher indium (In) content than that in InGaAs in the intermediate barrier layer.

10. The semiconductor device according to claim 8, wherein:
    the dual quantum well layer has a structure where a lower barrier layer, the first well layer, the intermediate barrier layer, the second well layer, and an upper barrier layer are sequentially stacked, and
    the lower barrier layer and the upper barrier layer include InGaAs.

11. The semiconductor device according to claim 9, wherein:
    the dual quantum well layer has a structure where a lower barrier layer, the first well layer, the intermediate barrier layer, the second well layer, and an upper barrier layer are sequentially stacked, and
    the lower barrier layer and the upper barrier layer include InGaAs.

12. The semiconductor device according to claim 10, wherein the lower barrier layer, the intermediate barrier layer, and the upper barrier layer include InGaAs of a same composition.

13. The semiconductor device according to claim 10, wherein the lower barrier layer, the intermediate barrier layer, and the upper barrier layer include InGaAs of different compositions.

14. The semiconductor device according to claim 1, wherein:
    the first semiconductor layer and the second semiconductor layer include AlGaAs,
    the intermediate barrier layer includes GaAs, and
    the first well layer and the second well layer include InGaAs.

15. The semiconductor device according to claim 14, wherein:
the dual quantum well layer has a structure where a lower barrier layer, the first well layer, the intermediate barrier layer, the second well layer, and an upper barrier layer are sequentially stacked, and
the lower barrier layer and the upper barrier layer include GaAs.

16. The semiconductor device according to claim 1, wherein at least one of the first semiconductor layer and the second semiconductor layer define an electron supply layer.

17. A semiconductor device, comprising:
a first semiconductor layer provided over a substrate; an electron transit layer contacting a top of the first semiconductor layer: and
a second semiconductor layer contacting a top of the electron transit layer,
wherein the electron transit layer has a dual quantum well layer comprising a structure where a first well layer, an intermediate barrier layer, and a second well layer are sequentially stacked,
wherein an energy of a conduction band of the intermediate barrier layer is lower than an energy of conduction band of the first semiconductor layer and the second semiconductor layer,
wherein a ground level is generated in the first and second well layers, and a first excitation level is generated in the dual quantum well layer, and
wherein:
the first semiconductor layer and the second semiconductor layer include AlGaAs,
the intermediate barrier layer includes InGaAs, and
the first well layer and the second well layer include InGaAs that has a higher indium (In) content than that in InGaAs in the intermediate barrier layer.

18. The semiconductor device according to claim 17, wherein:
the dual quantum well layer has a structure where a lower barrier layer, the first well layer, the intermediate barrier layer, the second well layer, and an upper barrier layer are sequentially stacked, and
the lower barrier layer and the upper barrier layer include InGaAs.

19. The semiconductor device according to claim 18, wherein the lower barrier layer, the intermediate barrier layer, and the upper barrier layer include InGaAs of a same composition.

20. The semiconductor device according to claim 18, wherein the lower barrier layer, the intermediate barrier layer, and the upper barrier layer include InGaAs of different compositions.

* * * * *